United States Patent
Jiang et al.

(10) Patent No.: US 11,353,318 B2
(45) Date of Patent: Jun. 7, 2022

(54) MEMS TUNABLE VCSEL POWERED SWEPT SOURCE OCT FOR 3D METROLOGY APPLICATIONS

(71) Applicant: Thorlabs, Inc., Newton, NJ (US)

(72) Inventors: James Jiang, Hackettstown, NJ (US); Alex Cable, Newton, NJ (US)

(73) Assignee: Thorlabs, Inc., Newton, NJ (US)

( * ) Notice: Subject to any disclaimer, the term of this patent is extended or adjusted under 35 U.S.C. 154(b) by 0 days.

(21) Appl. No.: 17/123,979

(22) Filed: Dec. 16, 2020

(65) Prior Publication Data

US 2021/0102799 A1 Apr. 8, 2021

Related U.S. Application Data

(62) Division of application No. 16/709,494, filed on Dec. 10, 2019, now Pat. No. 10,890,431, which is a
(Continued)

(51) Int. Cl.
*G01B 9/02* (2022.01)
*G01B 11/00* (2006.01)
(Continued)

(52) U.S. Cl.
CPC ........ *G01B 11/005* (2013.01); *G01B 9/02004* (2013.01); *G01B 9/02044* (2013.01);
(Continued)

(58) Field of Classification Search
CPC . G01B 11/005; G01B 11/007; G01B 11/0608; G01B 11/2441; G01B 9/02004;
(Continued)

(56) References Cited

U.S. PATENT DOCUMENTS

| 9,127,929 B2 | 9/2015 | Siercks et al. |
| 2006/0195019 A1 | 8/2006 | Premachandran et al. |

(Continued)

FOREIGN PATENT DOCUMENTS

| EP | 1744119 A1 | 1/2007 |
| WO | 2017/165793 A1 | 9/2017 |

OTHER PUBLICATIONS

Elhady, Alaa et al., "Dual-Fiber OCT Measurements," Progress in Biomedical Optics and Imaging, SPIE International Society for Optical Engineering, Bellingham, WA, US, vol. 8934, pp. 89343J-89343J, dated Mar. 4, 2014.

(Continued)

*Primary Examiner* — Tarifur R Chowdhury
*Assistant Examiner* — Jonathon Cook
(74) *Attorney, Agent, or Firm* — Myers Wolin, LLC

(57) ABSTRACT

Disclosed is an optical probe system that is capable of high speed, high precision, and high resolution 3D digitalization of engineered objects. The 3D dimensional data of the engineered object is measured using a swept source optical coherence tomography system with improved speed, spatial resolutions, and depth range. Also disclosed is a type of coordinate measurement machine (CMM) that is capable of performing high speed, high resolution, and non-contact measurement of engineered objects. The mechanic stylus in the touch-trigger probe of a conventional CMM is replaced with an optical stylus with reconfigurable diameter and length. The distance from the center of the optical stylus to the measurement probe is optically adjusted to match the height of the object to be measured quickly, which eliminates one dimensional movement of the probe and greatly improves the productivity.

3 Claims, 25 Drawing Sheets

Related U.S. Application Data division of application No. 15/469,036, filed on Mar. 24, 2017, now Pat. No. 10,557,701.

(60) Provisional application No. 62/313,346, filed on Mar. 25, 2016.

(51) Int. Cl.

| | |
|---|---|
| *G01B 11/24* | (2006.01) |
| *G01B 9/02004* | (2022.01) |
| *G01B 9/02091* | (2022.01) |
| *G01B 11/06* | (2006.01) |
| *H01S 5/02251* | (2021.01) |
| *H01S 5/065* | (2006.01) |
| *H01S 5/10* | (2021.01) |
| *H01S 5/183* | (2006.01) |

(52) U.S. Cl.
CPC ........ *G01B 9/02091* (2013.01); *G01B 11/007* (2013.01); *G01B 11/0608* (2013.01); *G01B 11/2441* (2013.01); *H01S 5/02251* (2021.01); *H01S 5/0651* (2013.01); *H01S 5/1042* (2013.01); *H01S 5/183* (2013.01)

(58) Field of Classification Search
CPC ............ G01B 9/02044; G01B 9/02091; G01B 9/0209; G01B 9/02035; G01B 9/02048; G01B 9/02063; G01B 9/02064
See application file for complete search history.

(56) References Cited

U.S. PATENT DOCUMENTS

| | | | |
|---|---|---|---|
| 2007/0076222 A1* | 4/2007 | Kawahara | G01B 9/02048 356/511 |
| 2007/0183643 A1 | 8/2007 | Jayaraman | |
| 2009/0122302 A1 | 5/2009 | De Boer | |
| 2010/0033727 A1 | 2/2010 | Ko et al. | |
| 2012/0293807 A1* | 11/2012 | Sugita | G01B 9/02091 356/479 |
| 2013/0162978 A1 | 6/2013 | Yazdanfar et al. | |
| 2014/0276674 A1 | 9/2014 | Lee et al. | |
| 2016/0045116 A1 | 2/2016 | Kumar et al. | |
| 2016/0056613 A1 | 2/2016 | Makino et al. | |
| 2016/0059347 A1 | 3/2016 | Kogel-Hollacher et al. | |
| 2017/0265742 A1 | 9/2017 | Nozato et al. | |

OTHER PUBLICATIONS

Qi, Bing et al., "Dynamic focus control in high-speed optical coherence tomography based on a microelectromechanical mirror," Optics Communications, Elsevier, Amsterdam, NL, vol. 232, No. 1-6, pp. 123-128, dated Mar. 1, 2004.
Supplementary European Search Report with Annex to the European search report and Written Opinion issued by the European Patent office for corresponding European Patent Application No. EP 17 77 1250.2, dated Oct. 31, 2019.
D. Huang, E. A. Swanson, C. P. Lin, J. S. Schuman, W. G. Stinson, W. Chang, M. R. Hee, T. Flotte, K. Gregory, C. A. Puliafito, and J. G. Fujimoto, "Optical Coherence Tomography", Science 254, pp. 1178-1181, 1991.
S. H. Yun, G. J. Tearney, J. F. de Boer, N. Iftimia, and B. E. Bouma, "High-speed optical frequency-domain imaging", Optics Express vol. 11, pp. 2953-2963, 2003.
R. Huber, M. Wojtkowski, and J. G. Fujimoto, "Fourier Domain Mode Locking (FDML): A new laser operating regime and applications for optical coherence tomography", Optics Express vol. 14, pp. 3225-3237, 2006.
A. F. Fercher, C. K. Hitzenberger, G. Kamp, S.Y. El-Zaiat, "Measurement of intraocular distances by backscattering spectral interferometry", Optics Communications 117, 43-48, 1995.

N. Nassif, B. Cense, B. H. Park, S. H. Yun, T. C. Chen, B. E. Bouma, G. J. Tearney, and J. F. de BOER, "In vivo human retinal imaging by ultrahigh-speed spectral domain optical coherence tomography", Optics Letters vol. 29, pp. 480-482, 2004.
M. Wojtkowski, V. J. Srinivasan, T. H. Ko, J. G. Fujimoto, A. Kowalczyk, J. S. Duker, "Ultrahigh-resolution, high-speed, Fourier domain optical coherence tomography and methods for dispersion compensation", Optics Express vol. 12, pp. 2404-2422, 2004.
E. Beaurepaire, A. C. Boccara, M. Lebec, L. Blanchot, and H. Saint-Jalmes, "Full-field optical coherence microscopy", Optics Letters vol. 23, pp. 244-246, 1998.
A. Dubois, L. Vabre, A. C. Boccara, and E. Beaurepaire, "High-resolution full-field optical coherence tomography with a Linnik microscope", Applied Optics vol. 41, pp. 805-812, 2002.
V. Jayaraman, J. Jiang, H. Li, P. J. S. Heim, G. D. Coi F, B. Potsaid, J. G. Fujimoto, A. Cable, "OCT Imaging up to 760 kHz Axial Scan Rate Using Single-Mode 1310nm MEMS-Tunable VCSELs with >100 nm Tuning Range", 2011 Conference on Lasers and Electro-Optics (CLEO), Optical Society of America: Baltimore, MD., p. PDPB2, 2011.
S. Parthasarathy, J. Birk, J. Dessimoz, "Laser rangefinder for robot control and inspection", Proc. SPIE 336, Robot Vision, pp. 2-10, 1982.
S. Winkelbach, S. Molkenstruck, and F. M. Wahl, "Low-Cost Laser Range Scanner and Fast Surface Registration Approach", DAGM 2006, LNCS 4174, pp. 718-728, Springer 2006.
J. Geng, "Structured-light 3D surface imaging: a tutorial", Advances in Optics and Photonics 3, pp. 128-160, 2011.
Molesini G., G. Pedrini, P. Poggi, and F. Quercioli, "Focus Wavelength Encoded Optical Profilometer", Optics Communications 49, 229-233, 1984.
T. Wilson, ed., "Confocal Microscopy", Academic, San Diego, Calif., 1990.
I. Grulkowski, J. J. Liu, B. Potsaid, V. Jayaraman, C. D. Lu, J. Jiang, A. E. Cable, J. S. Duker, J. G. Fujimoto. "Retinal, anterior segment and full eye imaging using ultrahigh speed swept source OCT with vertical-cavity surface emitting lasers", Biomedical Optics Express vol. 3, pp. 2733-2751, 2012.
I. Grulkowski, J. J. Liu, B. Potsaid, V. Jayaraman, J. Jiang, J. Fujimoto, and A. E. Cable, "High-precision, high-accuracy ultralong-range swept-source optical coherence tomography using vertical cavity surface emitting laser light source", Opt. Lett. 38, pp. 673-675, 2013.
W. Drexler, M. Liu, A. Kumar, T. Kamali, A. Unterhuber, R. Leitgeb, "Optical coherence tomography today: speed, contrast, and multimodality," Journal of Biomedical Optics 19(7), 071412 (Jul. 31, 2014). http://dx.doi.org/10.1117/1.JBO.19.7.071412.
3D OCT-2000 Series, Optical Coherence Tomography, TOPCON Corporation, 2012 Retrieved from http://www.topconmedical.com/literature/3DOCT-2000_Series.pdf.
International Search Report with Written Opinion of the International Search Authority issued by the Federal Institute of Industrial Property, for corresponding International Patent Application No. PCT/US2017/024062, dated Aug. 31, 2017.
Non-Final Office Action issued by the United States Patent and Trademark Office for corresponding U.S. Appl. No. 15/469,036, electronically delivered on May 15, 2019.
First Office Action issued by the China National Intellectual Property Administration for corresponding Chinese Patent Application No. 2017800319269, dated Mar. 1, 2021, with an English translation.
Response to Communication pursuant to Rules 70(2) and 70a(2) EPC dated Nov. 28, 2019, issued by the European Patent Office for corresponding European Patent Application No. 17 771 250 2, dated Jun. 8, 2020.
Communication pursuant to Article 94(3) EPC issued by the European Patent Office for corresponding European Patent Application No. 17 771 250.2-1010, dated Jun. 24, 2021.
Elhady et al., "Dual-Fiber OCT Measurements", Optical Coherence Tomography and Coherence Domain Optical Methods in Biomedicine XVIII, 2014, pp. 89343J-1-89343J-3, Proc. of SPIE vol. 8934, 2014 SPIE.

(56) References Cited

OTHER PUBLICATIONS

Qi et al., "Dynamic focus control in high-speed optical coherence tomography based on a microelectromechanical mirror", Optics Communications, Mar. 2004, pp. 123-128, vol. 232, Issues 1-6, Elsevier, Amsterdam, NL.
Second Notification of Office Action issued by the China National Intellectual Property Administration for corresponding Chinese Patent Application No. 201780031926.9, dated Aug. 31, 2021, with an English translation.

* cited by examiner

MEMS TUNABLE VCSEL POWERED SWEPT SOURCE OCT FOR 3D METROLOGY APPLICATIONS

CROSS REFERENCE TO RELATED APPLICATIONS

This application is a divisional of U.S. patent application Ser. No. 16/709,494 filed on Dec. 10, 2019, which is a divisional of U.S. patent application Ser. No. 15/469,036 filed on Mar. 24, 2017, which claims the benefit of U.S. Provisional Patent Application No. 62/313,346 filed on Mar. 25, 2016. The disclosures of U.S. Provisional Patent Application 62/313,346, U.S. patent application Ser. No. 15/469,036 and U.S. patent application Ser. No. 16/709,494 are hereby incorporated by reference.

FIELD OF THE INVENTION

This invention is related to an optical probe system that is capable of high speed, high precision, and high resolution 3D digitalization of engineered objects. The 3D dimensional data of the engineered object is measured using a swept source optical coherence tomography system with improved speed, spatial resolutions, and depth range.

This invention is also related to a novel type of coordinate measurement machine (CMM) that is capable of performing high speed, high resolution, and non-contact measurement of engineered objects. The mechanic stylus in the touch-trigger probe of a conventional CMM is replaced with an optical stylus with reconfigurable diameter and length. The distance from the center of the optical stylus to the measurement probe is optically adjusted to match the height of the object to be measured quickly, which eliminates one dimensional movement of the probe and greatly improves the productivity.

BACKGROUND

OCT Imaging

Optical Coherence Tomography (OCT) is a non-invasive, interferometric optical imaging technique that can generate micron resolution 2D and 3D images of tissue and other scattering or reflective materials. OCT is often used for biomedical imaging or materials inspection, and is part of a larger family of Laser Scanning Microscopy (LSM) techniques. First demonstrated for imaging the human eye imaging in 1991[Ref. 1], OCT has since been established as a clinical standard for diagnosing and monitoring treatment of eye disease. OCT has developed from operating in the time domain [Ref. 1], to now operating in the Fourier Domain [Refs. 2-6] with the depth information being frequency encoded in the captured optical interference fringe signals. Swept source OCT (SS-OCT) [Refs. 2-3] uses a wavelength scanning light source to illuminate an optical interferometer, and capture the time encoded interference fringe signals using a high speed detector. Spectral domain OCT (SD-OCT) [Refs. 4-6] uses a broadband source to illuminate an optical interferometer, and uses an optical spectrometer to record the spatially encoded interference fringe signals using a line-array detector (i.e. CCD or CMOS). SS-OCT and SD-OCT are two well documented Fourier domain OCT approaches. While this work will primarily describe systems using SS-OCT, it should be understood that other OCT techniques can be utilized with varying levels of success as each technique has its benefits and limitations. The Interferometer that is used to process the back reflected light and produce an interferogram is typical a Michelson design, but can be any of other design types also.

As an alternative technique to beam scanning OCT, Full-Field Optical Coherence Tomography (FF-OCT) is based on white-light interference microscopy [Ref. 7]. FF-OCM produces high resolution tomographic images in the en-face orientation by arithmetic combination of interferometric images acquired with an area camera and by illuminating the whole field-of-view using a low-coherence light source [Ref. 8].

OCT is capable of acquiring three-dimensional (3D) images of soft yet highly scattering biological objects typically with micron level resolution throughout the imaging volume. Typical data sets provide full volumetric details within an overall volume of approximately 10 mm (length)× 10 mm (width)×3 mm (depth) when imaging translucent tissue objects like human skin. SS-OCT systems frequency encode the distance of an object using a reference delay located in the OCT instrument. The further an object feature is from the reference delay, the higher the frequency of the OCT interference fringe signals occur.

This work seeks to extend this relatively new technology to applications that are not limited to biological applications. A broad class of potential objects to be imaged is being defined as Engineering Objects, this term seeks to capture any object from natural or manmade, with an emphasis on manmade non-biological objects. While not directly excluding the biological objects this work presents an instrument and technology that is more appropriate for manmade Engineering Objects that range from being opaque to transparent. The term Engineering Objects will be used to refer to this general class of objects.

When the objects are made from materials that don't allow light to penetrate the surface, and at the same time reflect a measureable fraction of a light, then these objects will be called Reflective Objects. Here a measureable fraction is quite loose, but assumed to be in the range of 0.1% to 100%. An example of a Reflective Object could be a freshly machined aluminum precision mechanical part with a surface finish that is of sufficiently high quality so as to reflect a portion of an incoming laser beam. With the remainder of the light being scattered.

There are a number of technical challenges that stand in the way of applying what's been learned from the application of OCT to the biological sciences to the broader class of Engineering Objects. The foremost challenge has been the limited depth range over which most OCT systems operate, typically in the range of 5 to 20 mm range. This limitation comes from the coherence length limitation of the swept source or the spectral resolution limitation in an optical spectrometer. This limited measurement range meant that the reference surface in an OCT system would need to be positioned with optical delay difference in a few tens of millimeters from the object surface, in order to capture a 3D digital image of an object.

Another limitation is the previously mentioned frequency encoded signaling scheme inherent in SS-OCT, wherein the longer the distant of an object feature the higher the frequency of OCT signals. Currently swept source lasers are capable of operating at well over 100 kHz [Ref. 9], and an analog to digital (A/D) converter needs to operate in the range of 500 MS/s (Mega Samples per second) when a ranging depth of 10 mm is acceptable. It will be shown that scaling up the ranging depth while also going to higher laser scan rate requires extremely high A/D converter speeds which significantly increases system cost.

This work will present a series of adaptations to the OCT based instruments that are designed for the life science applications. These new instruments will be shown to operate in a diverse range of industrial applications. It is also understood that bringing some of these new techniques back to the life sciences will offer improvements within that market, ranging from enhanced robotic surgery, to whole body scanning of living organisms.

The first illustration of an industrial application of this new technology will make efficient use of very high speed swept lasers in metrology applications. An OCT enhanced coordinate measuring machine can be used as a metrology tool in machine shops that produce precision metal parts using machine tools.

A coordinate measuring machine (CMM) is a well-known device that is well suited to measuring the dimensions of objects that aren't too complex and can fit within the object volume of the CMM. More specifically, the large family of parts encompassed in the subset of Reflective Objects made from aluminum and stainless steel is considered. A conventional CMM uses a mechanical probe with electronic touch trigger to send the X, Y, Z coordinate information about the Engineering Object to the user and/or a computer. The older touch probe CMM machines would be used to verify a number of critical dimensions on a machined part to validate a prototype or a production setup. Much as a machinist would spot check a relatively small numbers of points on a machined part to ensure it is made to the tolerances specified in the corresponding mechanical drawing or solid model. The most common CMMs use a gantry type structure with electronic motion control that include both a capability to power a touch probe as well as a capability to precisely locate the probe in space.

Once an object is in production the CMM could be used to periodically test this relatively small number of data points as compared to the typically millions or more data points required to digitally render a part with high fidelity. Newer CMMs utilize drag probes that take data points at regular intervals providing for a higher density of points, needed for the more complex shapes possible with CNC machine tools.

A CMM can be thought of a class of robots within a broader range of industrial robots that perform geometrical measurement of the Engineering Objects. When a CMM is referenced its meaning typically includes a touch probe with a Stylus that contacts the surface via a hardened ball, ruby or tungsten carbide. The touch probe is capable of making measurements relative to a laboratory coordinate system. The CMM also offers a teach mode where the user takes a set of measurements of a "golden object", the system then repeats this set of measurements on subsequent objects.

The CMM has historically been an instrument that was used to verify critical dimensions, much as a machinist might use a "machinist micrometer" to spot check a feature on a part during or after machining. As non-contact CMM probes have become available, dense whole part scanning has become possible, but not typically required on the shop floor. If an Engineering Object has free-form geometry then dense sampling is more likely to be beneficial. The CMM approach is often adequate if there is sufficient prior knowledge about the Engineering Object and its features to be inspected, allowing system to plan an optimized measurement path, especially if the actual features do not deviate too much from what's expected.

Many non-contacting methods are recently available that improve the speed while maintaining the resolution and accuracy expected for a CMM. These methods include single point laser triangulation [Ref. 10], laser line scanning [Ref 11], structured-light illumination [Ref 12], chromatic white light scanning [Ref. 13], and single wavelength confocal imaging [Ref 14]. Some non-contact measurements are typically inferior to contact measurements in resolution and accuracy but offer higher measurement speed. Recently the non-contact Confocal microscope systems have shown both improved speed and resolution, however because a high numerical aperture objective is required to ensure high spatial resolution, the working distance of a confocal microscope is often limited to a few millimeters. More recently, non-contact CMM probes based on optical interference techniques including optical coherence tomography method [Refs. 15, 16] have been proposed.

Many CMMs utilize a mechanical probe that makes physical contact with the Engineering Object. In order to measure the Engineering Object, the probe needs to be positioned in X, Y, and Z directions relative to the Engineering Object, and then it needs to contact the Engineering Object. This movement of mechanical elements, followed by probe contact is a time consuming process. A SS-OCT based CMM (SS-CMM) would be capable of making over 1,000,000 points per second, a speed not possible with contact or current non-contact CMMs.

The unique frequency encoding of distance allows the SS-CMM to take data with a large degree of flexibility in the actual distance between the Engineering Object and the position of the CMM probe. This freedom allows the SS-CMM to take data points even at irregular separations between the Engineering Object and the location of the probe. The limit to this feature of the SS-CMM is the laser beam divergence that increases as the beam waist is made smaller, a useful concept that captures this feature is the Rayleigh Range of a focused beam. The Rayleigh length is the distance over which the beam waist varies by the square root of 2 or approximately 1.414 times. This Rayleigh length is a useful parameter as it can be used to quantify the working distance of a SS-CMM. The SS-CMM can be outfitted with a dynamic focusing control mechanism that can rapidly shift the location of the beam waist.

With the common gantry style CMMs the measurement volume is defined by the limits of the movement in the X, Y, and Z directions. This is a limitation that would be greatly reduced by use of a SS-OCT based optical probe as it can scan areas outside the confines of a fixed measuring envelope using scanning laser beams.

The mechanical probe of a CMM is a delicate accessory that is prone to wear. The non-contact SS-OCT probe would eliminate wear. Many mechanical probes are delicate accessory that needs to approach the Engineering Object being mapped nearly perpendicular to the point that is being objected. The non-contact SS-OCT probe can be configured to overcome this restriction.

The object surfaces need to be rigid and have low contact force with the probe, this sets an upper limit on the speed with which the trigger point in a touch probe can be achieved. This same issue does not apply to a SS-CMM.

Delicate parts that do not permit single point contacting cannot be inspected with a mechanical probe. Additionally scanning mechanical probes pose an even greater risk of damaging the Engineering Object being measured. Hence the need for non-contacting solutions that have more recently been developed. These newer methods include: single point laser triangulation, laser line scanning, confocal imaging, chromatic white line scanning (a form of confocal imaging), digital camera based structured illumination, and optical interferometry based non-contacting probes.

The single point laser triangulation method requires a laser source and a position sensitive detector. The limitations are measurement accuracy that depends on the size of the instrument: longer baseline length between the source and the detector gives higher accuracy. Installing this type of instrument in commercial systems often requires a space larger than ideal. Also the relationship between detector output signal and object distance is not linear.

The laser line scanning, or more generally the structured illumination method, projects lines or 2D patterns on the object surface, and captures the line shape introduced by the object surface using a 2D digital camera. By scanning the laser line across object surface, or illuminating the surface with a grid pattern, the 3D surface profile of the object can be measured. This method is relatively fast however the measurement results largely depend on the illumination technique: both the transverse and depth resolution of the measurement depend on the width of the laser illumination line, and the size of the object that can be scanned is also limited by the illumination scheme used. Another drawback of this technique, is the limited dynamic range of the measurement, the Engineering Objects that can be 3D Digitized using this technique are limited in terms of their optical and physical properties, for example if the Engineering Object has large variations in reflectivity or largely scatters the illumination beams.

The chromatic white line scanning method leverages the principle introduced by Marvin Minsky in 1957 known as the confocal imaging. In chromatic white line scanning the instrument focuses different wavelengths from a white light source, at different focal depths. This technique uses a wavelength dependent focal length optical system. The object's surface location can be calculated by measuring the wavelength of reflected light passed through a confocal aperture. This method can measured very high transverse (<1 μm) and depth (a few nm) resolution about object positions, due to the confocal principle used. However, in this measurement approach the object's surface being imaged needs to be located very near the focal distance of the confocal objective, and the maximum object distance that can be measured is limited by the instruments ability to position the confocal measurement head at a precisely fixed distance above the object surface.

The OCT based 3D surface measurement methods have been developed in recent years. In EP 1 744 119, an apparatus for surface measurement using optical interference signals generated by a frequency swept source is disclosed. In U.S. Pat. No. 9,127,929, a frequency swept source based CMM is equipped with a probe capable of beam rotational control, allowing perpendicular beam impingement on object surface to improve the measurement accuracy. The swept sources disclosed in above examples are of external cavity type or fiber ring type tunable lasers, with wavelength selective element external to the gain media of the laser. These types of swept sources have proven to support maximum coherence length of a few tens of mm. When measuring industrial work pieces with height variation orders of magnitude larger than coherence length of the swept source, the probe needs to move to close to the surface, or to follow the height variations of the object, in order to generate OCT interference fringe signals with sufficient fringe contrast and signal-to-noise ratio for measuring surface height information. This means frequent probe position adjustment is needed which can significantly slow down the speed of the system measuring a large object.

Since the first demonstration of a fast, broadband MEMS tunable VCSEL for OCT imaging in 2011 [Ref 9], swept source OCT powered by MEMS tunable VCSEL have achieved a combination of ultrahigh sweep speeds, wide spectral tuning range, flexibility in sweep trajectory, and extremely long coherence length [Refs. 17-18], which cannot be simultaneously achieved with other swept source technologies to date. The unique laser cavity design of MEMS tunable VCSEL of micron-scale cavity length enables single mode operation without mode hopping. Consequently, the coherence length of the laser can be extremely long. The sweeping of output wavelength of the VCSEL is the inherent result from the laser cavity change by moving the MEMS mirror that defines the cavity length together with another fixed mirror. This wavelength selection mechanism is fundamentally different from all other types of swept sources including external cavity tunable lasers and fiber ring tunable lasers. The long coherence length and ultra-high speed of MEMS tunable VCSEL brought exciting new applications as well as new challenges to the OCT system design, because all conventional SSOCT systems have a finite maximum electronic detection bandwidth for their detector systems, trade-off must be made when optimize the system for either high depth resolution, long depth measurement range, or high measurement speed. Another challenge is related the optimal transverse resolution of the system, to maintain minimum optical beam spot size over the very long depth measurement range, since the object surface can be at arbitrary height. Techniques are disclosed to overcome above limitation and challenges, as detailed in the following part of this application. The adaptation of MEMS tunable VCSEL powered swept source OCT system for a coordinate measurement machine and its application in measuring industrial objects are also disclosed.

Understand the Measurement Optical Resolution

In an OCT system, unlike other laser scanning imaging system, the optical resolution in the X and Y dimensions (see FIG. 1) are decoupled from the optical resolution in Z (the depth direction), as they are determined by different physical properties of the optical system, hence transverse resolution and depth resolution are separately discussed.

Recalling that the basic OCT measurement consists of an A-Scan which can locate surfaces over a range of depths simultaneously, not just at the focal point of the objective. The transverse resolution however is smallest at the waist of the focused OCT laser beam, and is determined by the wavelength and focusing condition of the objective lens (see Eq. 1). Typically in an OCT system the transverse resolution varies slowly with depth, and is a minimum at the beam waist (focus), becoming coarser as the depth increases or decreases about this waist depth. Gaussian Beam Optics is applicable here, and shows how a system can trade off resolution at the beam waist, for a smaller variation across the entire depth range of interest. The details are explored below, starting with Equation 1 and FIG. 1, combined they show the relationship between the objective lens used and the resulting shape of the probe beam.

$$\Delta x = \Delta y = 1.22 \frac{f \lambda_0}{D} \qquad \text{(Eq. 1)}$$

In Eq. 1, $\lambda_0$ is the center wavelength, D is the diameter of the laser beam as it enters the objective lens, and f is the focal length of the objective lens, this formula assumes that the laser beam quality is close to ideal as typically is the case for Swept Source Lasers that are coupled into single mode optical fiber (as is standard practice in the biomedical applications of SS-OCT).

The depth range is defined as the $2Z_R$ centered at the waist of the beam. For example a 10 mm focal length lens and a 1 mm diameter 632 nm laser beam the waist diameter will be about 8 um, and $2Z_R$ will be equal to about 160 um. Using the same 1 mm diameter laser, but changing the focal to 100 mm then the waist diameter will be approximately 80 um and $2Z_R$ will equal 16 mm.

In an OCT System the depth resolution is independent of the transverse resolution, with the depth resolution remaining constant along the full depth range of the instrument. Assuming a Reflective Object, the depth range is the distance over which the light from the object and the reference light can constructively interfere with sufficient contrast to produce a signal with a SNR sufficient to ensure detection.

The calculated depth resolution is inversely proportional to the bandwidth of the light source. Assuming a Gaussian spectral shape of the light, the theoretical depth resolution $\Delta_z$, is given by:

$$\Delta z = 0.44 \frac{\lambda_0^2}{\Delta \lambda} \quad \text{(Eq. 2)}$$

where $\lambda_0$ is the center wavelength and $\Delta\lambda$ is the full width half max (FWHM) of the light source spectrum. Table 1 shows the theoretical transverse and depth resolution values for some common OCT systems, where the assumed $\Delta\lambda$ is typically about 5% of the center wavelength given as $\lambda_0$, with a nearly Gaussian shape spectral profile:

TABLE 1

Calculated OCT system resolution values

| | | | | |
|---|---|---|---|---|
| OCT source center wavelength | nm | 850 | 1050 | 1300 |
| OCT source spectral bandwidth (−3 dB) | nm | 50 | 60 | 60 |
| Focal length of the objective lens | mm | 10 | 10 | 10 |
| beam diameter | mm | 3 | 3 | 3 |
| Transverse resolution | micron | 3.46 | 4.27 | 5.29 |
| Depth resolution | micron | 6.4 | 8.1 | 12.4 |

Biomedical OCT images are constructed using the intensity information of the interference fringe signals, this provides an imaging capability that includes the interior as well as exterior surfaces of the entire 3D volume. In this context, the depth resolution can be understood as the minimum distance between two reflection surfaces in the depth direction that can be distinguished in an OCT image. As seen from the calculation in Table 1, the depth resolution is limited to a few microns for common OCT systems. Higher resolution is often required in material surfaces analysis, such as measuring the surfaces of machined metal parts or surfaces of optical mirrors. While the depth resolution can be enhanced by combining multiple swept source lasers, it will be apparent that for the purposes of examining Reflective Objects the resolution can be greatly enhanced by calculating the centroid of the signal that results from an isolated surface.

Understand the Relationship Between Speed, Resolution, and Depth

MEMS tunable Vertical-Cavity Surface-Emitting Lasers (VCSELs) are an ideal source for SS-OCT imaging, optical metrology, and spectroscopy applications because of their micron scale laser cavity length. Low mirror mass enables high sweep speeds greater than one million scans per second. The VCSEL design supports single mode operation without mode hops while scanning at high repetition rates. The single mode operation of the laser permits coherence length longer than meters during the fast wavelength sweep, and high quality interference fringe signals generated from optical interferometers of long delays.

In swept source OCT, the maximum depth of reflection that can be measured by the system is determined by two factors: the coherence length of the source and the electronic frequency bandwidth of the detection system. The coherence length corresponds to the optical delay in the interferometer at which the interference fringe contrast drops to 50%. Beyond the coherence length of the source the measurement sensitivity of a swept source OCT system drops significantly. As for the detection system limitation, SS-OCT frequency encodes the depth information, hence it is important that the detection system must have sufficient bandwidth to capture the high frequency signals that result from long standoff distances combined with high speed wavelength scanning of the VCSEL.

More formally, the coherence length of a swept source is defined as the averaged instantaneous coherence length over the entire wavelength range of the source. Because swept source does not emit light at a constant wavelength, instead the output wavelength changes as a periodic function of time. The instantaneous coherence length is given by:

$$L_c = \frac{2\ln 2}{\pi} \frac{\lambda^2}{\Delta\lambda} \quad \text{(Eq. 3)}$$

where $\lambda$ is the instantaneous output wavelength and $\Delta\lambda$ is the instantaneous line width of the source respectively. In experiment, the coherence of the swept source is measured as the path length difference in the two interferometer arms where the interference fringe contrast drops to 50% of the fringe contrast at zero path length difference. A long coherence swept source like the VCSEL can generate high contrast interference fringe signals from long interferometer delays. The coherence length is an important specification for a swept source laser because it imposes a limitation on depth measurement range from the source side. It should be noted that while the 50% fringe contrast test provides practical information as to the finite range over which a SS-OCT will work, it is important to remember that various applications will in some cases be less sensitive to this 50% point, such as in the case with a reflective metal object machined to generally accepted surface finishes.

The bandwidth of the complete detection system is an important element in a SS-CMM, the system consisting of the photo detectors, amplifiers, and data acquisition devices. The response time of the photo detectors, frequency bandwidth and slew rate of the amplifiers, and the object rate of the data acquisition device all affect the detection system's ability to measure the high frequency interference fringe signals. Typically the frequency response of a detection system degrades at higher frequencies. Therefore, it is important to control the frequency bandwidth of the interference signals to match the optimal frequency response range of the detection system.

The electronic frequency of a signal coming from a depth D is given by:

$$f(D) = \frac{2 \cdot R_{Ascan} \cdot \Delta\lambda \cdot D}{\lambda_0^2} \quad \text{(Eq. 4)}$$

where $\lambda_0$ is the center wavelength, $\Delta\lambda$ is the FWHM of the wavelength sweep range of the swept source, and $R_{scan}$ is the repetition rate of the laser.

For a system operating with a maximum depth $D_{max}$ of 10 mm and a laser repetition rate of 100 kHz, a center wavelength of 1 μm and a FWHM tuning range of 50 nm yields a signal bandwidth f (10 mm)=$10^8$ Hz=100 MHz.

Because the interference fringe signals coming from zero delay is a DC signals, the required detection bandwidth is from DC to f ($D_{max}$). Required by the sampling theorem, the sampling rate (Sa) of the data acquisition device is:

$$Sa \geq 2f(D_{max}) \qquad \text{(Equation 5)}$$

Using Eq. 5 for this example system the minimum sampling rate would need to be 200 MHz. While commercial DAQ cards (ATS9360 by Alazar Technologies Inc., Canada) are available with GHz sampling rate it would be advantageous to manage the system such that the maximum sampling rate is controlled without sacrificing the overall performance of the system. Reducing the bandwidth of the detection system not only reduces the total cost of the system, but also limits the total amount of broadband noise that is seen by the detectors.

For a particular detection system where the maximum detection bandwidth f($D_{max}$) is a constant, the relationship between the maximum measurement depth, depth resolution and the swept rate of the source become:

$$\frac{R_{Ascan} \cdot D}{\Delta z} = const \qquad \text{(Eq. 6)}$$

Therefore, trade-off must be made if a swept source OCT system is applied for measurement requiring different speed, spatial resolution and depth range.

SUMMARY

One embodiment provides an optical probe system for measuring physical and geometrical data from an object including: a light source configured to generate light emission over a wavelength range; a measurement probe configured to deliver a portion of the light emission from the light source as an optical beam to measure the object, and collect the light from the object; the measurement probe having a beam focusing control mechanism; a reference light generator configured to receive a portion of the light emission from the light source to generate a reference light, the reference light generator having an optical path with adjustable optical delay; and an optical interferometer configured to receive the light from the object collected by the measurement probe and the reference light, and generate interfere fringe signals recorded by a detection system; a signal processor configured to process the interference fringe signals to obtain an optical delay difference between the light from the object and the reference light; a first control loop configured to control the optical beam focusing conditions in the measurement probe based on the optical delay difference obtained by the signal processor, causing the optical beam to be always focused on the object by the beam focusing control mechanism; and a second control loop configured to control the adjustment of optical delay in the reference light generator based on the optical delay difference obtained by the signal processor, causing interference fringe signals to be always within an optimal detection range of the detection system.

Another embodiment provides a method to measure physical and geometrical data of an object using an optical coherence tomography (OCT) system, the method including: operating the OCT system in a low depth resolution mode to measure the object height with low resolution within an extended depth measurement range, utilizing a partial spectral bandwidth of the light source; changing an optical delay in a reference light generator of the OCT system to match an object height measured in the low depth resolution mode; then operating the OCT system in a high depth resolution mode to measure the object height with high resolution, utilizing a full spectral bandwidth of the light source; and the object height is the measured object height in high depth resolution mode adjusted by the changes made to the optical delay in the reference light generator.

Another embodiment provides a coordinate measurement machine including: a surface configured to hold an object to be measured; a measurement probe configured to move to a known spatial coordinates near the object by a moving mechanism, the measurement probe having re-configurable optics inside; an optical stylus generated by the reconfigurable optics inside the measurement probe, wherein the optical stylus: has an adjustable diameter and length; has an adjustable distance from the optical stylus center to the probe; and is in optical contact with the object; an optical coherence tomography (OCT) system configured to measure an optical delay difference between the light from the object and a reference light from a reference position using an optical interference method, to determine a height of the object; a first control loop configured to control the distance from the optical stylus center to the probe using the object height measured by the OCT system, causing the optical stylus in optical contact with the object; and a second control loop configured to control the reference position of the reference light, using the object height measured by the OCT system, causing the optical interference signals to be within an optimal detection range of the OCT system.

DETAILED DESCRIPTION OF THE PREFERRED EMBODIMENTS

Figure 1:
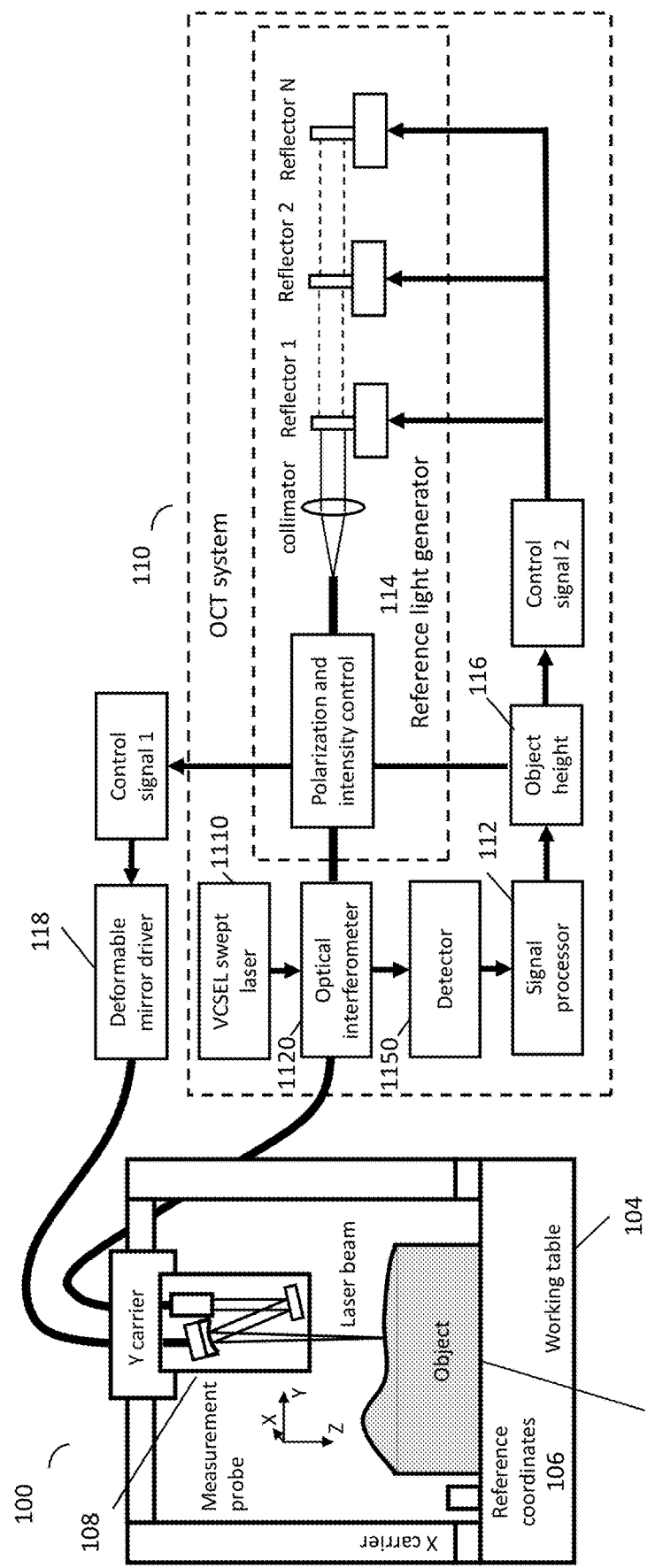
FIG. 1 shows an OCT enhanced coordinate measuring machine according to an embodiment.

This disclosure describes the best mode or modes of practicing the invention as presently contemplated. This description is not intended to be understood in a limiting sense, but provides an example of the invention presented solely for illustrative purposes by reference to the accompanying drawings to advise one of ordinary skill in the art of the advantages and construction of the invention. In the various views of the drawings, like reference characters designate like or similar parts.

1: Swept Source CMM with Improved Resolution and Depth Range

In this section, an optical instrument for measuring Reflective Objects dimensional features is disclosed. The Instrument uses optical coherence tomography (OCT) and is capable of both sparse and dense sampling. The OCT system can measure object height information at high speed. The measured object height is used for close-loop control of two important parameters: the optical beam focusing condition in the measurement probe, and the optical delay in the reference light generator. By close-loop controlling the beam focusing on the object, the transverse resolution of the measurement is preserved. By close-loop controlling the optical delay in the reference light generator, the required detection bandwidth can be reduced; alternatively the total depth measured range can be extended. When measuring object height information, the depth resolution is improved by finding the centroid of the peak in the depth profile and determining the unwrapped phase of the interference fringe signals. When measuring very large object or an object with height variations larger than the depth measurement range of the OCT system, a dual resolution modes measurement method is invented.

FIG. 1 shows the block diagram of the OCT enhanced coordinate measuring machine (CMM) 100. An object 102 to be measured is placed on a working table 104. The working table provides reference coordinates 106 to facilitate the measurements. A measurement probe 108 can be moved in X and Y directions to known coordinate positions to scan the object by existing motion mechanisms installed on the CMM, such as XY gantry stages or an articulated robot arm. The measurement probe is connected to an OCT system 110 and can measure a depth profile of the object at the scan rate of the OCT system, without moving the probe in the Z direction, significantly improve the speed to scan the object. The object height is determined as the first or the strongest peak in a depth profile. A signal processor 112 processes the interference fringe signals generated from the optical interference of the light from the measurement probe and the light from the reference light generator 114, to obtain the object height information. The measured object height 116 is used to generate two control signals. Control signal 1 is connected to a deformable mirror driver 118, to control the curvature of a deformable mirror installed inside the measurement probe, to control the beam focusing condition to keep the beam focused at object height. Control signal 2 is used to configure the optical delay inside the reference light generator, and select an optical delay that mostly matches the measured object height. The measured object height is adjusted by the change in optical delay which has been previously calibrated.

The following sections describe a few important specifications of the system, and improvement methods applicable to the invented instrument.

Depth Resolution Improvement Method: Determining the Unwrapped Phase

When the light enters an optical interferometer with two different optical paths and optical delay difference d between the two paths, the intensity of the interference fringe signals of the light from the object and the reference light is:

$$I = I_1 + I_2 + 2\sqrt{I_1 I_2}\cos(\phi_1 - \phi_2) = I_1 + I_2 + 2\sqrt{I_1 I_2}\cos(\Delta\phi) \quad \text{(Equation 7)}$$

where $I_1$ and $I_2$ are the intensities of light from the object and the reference light respectively, and $\Delta\phi = (\phi_1 - \phi_2)$ is the phase difference between them. $\Delta\phi$ is also the phase of the interference fringe signals. The relationship between the phase and the optical delay is:

$$\Delta\phi = \left(\frac{2\pi}{\lambda_0}\right) d \quad \text{(Eq. 8)}$$

or $$d = \Delta\phi \cdot \frac{\lambda_0}{2\pi} \quad \text{(Eq. 9)}$$

Therefore, if the center wavelength of the source $\lambda_0$ is known, and the phase of the interference fringe signals $\Delta\phi$ can be accurately measured, the optical delay difference between the light from the object and the reference light can be calculated above equation.

The challenge is the ambiguity in the measurement of unwrapped phase $\Delta\phi$, because the measured phase is ambiguous by an integer number of N when the unwrapped phase $\Delta\phi$ is written as:

$$\Delta\phi = N \cdot 2\pi + \Delta\varphi, -\pi \leq \Delta\varphi \leq \pi \quad \text{(Equation 10)}$$

where $\Delta\varphi$ is the wrapped phase which is measureable in any interference fringe signal. N is the integer number in the unwrapped phase $\Delta\phi$ of the interference fringe cycles and is very often lost. To recover this integer number N is an important task if it is desired to accurately measure the optical delay d beyond the depth resolution of the OCT system.

An OCT system can determine the integer number of N in the unwrapped phase $\Delta\phi$, assuming a single optical delay d between the light from the object and the reference light is to be measured. This is done by performing frequency analysis of the acquired interference fringe signals, calculating a depth profile based on intensity output of the frequency analysis, and measuring the peak location in the depth profile using appropriate algorithms.

The free spectral range (FSR) $\Delta f$ in the interference fringe signals of an optical interferometer with optical delay d is:

$$\Delta f_{FSR} = \frac{c}{d} \quad \text{(Eq. 11)}$$

where c is the speed of light.

Since $$f = \frac{c}{\lambda} \quad \text{(Eq. 12)}$$

the total optical frequency span of the laser sweep is:

$$\Delta f_{sweep} = -\frac{c}{\lambda_0^2}\Delta\lambda \quad \text{(Eq. 13)}$$

where $\lambda_0$ is the center wavelength and $\Delta\lambda$ is the wavelength sweep range of the swept source.

The electronic frequency of the interference fringe signals from optical delay d is:

$$f_{electronic} = \frac{R_{Ascan} \cdot \Delta f_{sweep}}{\Delta f_{FSR}} = \frac{R_{Ascan} \cdot \Delta\lambda \cdot d}{\lambda_0^2} \quad \text{(Eq. 14)}$$

where $R_{Ascan}$ is the swept rate of the swept source.

The optical delay d can be estimated from measuring a peak position in the intensity spectrum of the interference fringe signals, after performing electronic frequency analysis of the signals, such as using an electronic frequency analyzer, or applying fast Fourier transform (FFT) of the digitized interference fringe signals.

$$d = \frac{f_{electronic} \cdot \lambda_0^2}{R_{Ascan} \cdot \Delta\lambda} \quad \text{(Eq. 15)}$$

The electronic frequency analyzing process usually has a finite frequency resolution window, and the frequency spectrum data is organized into discrete frequency bins. The full-width-half-maximum (FWHM) value of a peak in the frequency spectrum is the actual depth resolution of the OCT system. One peak usually occupies a few frequency bins in the spectrum. Applying a center-of-mass algorithm to calculate the centroid position of the peak can help improve the accuracy of the peak position measurement. The centroid position is then used to calculate the optical delay difference between the light from the object and the reference light. The optical delay calculated using peak centroid detection can achieve better resolution than the depth resolution of an OCT system, without using the phase information of the interference fringe signals.

It is possible to determine the integer number N in the unwrapped phase $\Delta\phi$, using the optical delay d calculated using Eq. 15 with peak centroid detection of an OCT depth profile.

$$N = \text{floor}\left(\frac{d}{\lambda_0}\right) \quad \text{(Eq. 16)}$$

where the floor( ) function returns the largest previous integer number of a input real number. It is required that the measurement accuracy in d from peak centroid detection of an OCT depth profile is higher than the center wavelength of OCT system, in order to get the most accurate number of N. An error in d that is smaller than $\lambda_0$ is discarded by the floor( ) function.

The wrapped phase $\Delta\varphi$ can be measured from the phase analysis of the interference fringe signals, such as calculating phase versus frequency from the FFT output.

$$\Delta\varphi = \text{Phase}[FFT(A)] = \arctan\left(\frac{\text{imag}[FFT(A)]}{\text{real}[FFT(A)]}\right) \quad \text{(Eq. 17)}$$

After knowing N using Eq. 16 and knowing $\Delta\varphi$ using Eq. 17, the value of the original unwrapped phase $\Delta\phi$ can be determined using Eq. 10, and the optical delay of light from the object and the reference light can be calculated using Eq. 9. It is now possible to achieve sub-wavelength resolution in the nanometer range which is orders of magnitude better than the micron level depth resolution of the OCT system.

One task of this invention is for an OCT system to be able to measure the dimension of an object using the unit of optical wavelength. There will be a large real number if an object dimension is divided by optical wavelength. The integer part of this large real number is determined using Eq. 16 and the fractional part of this large real number is determined using Eq. 17. The final measurement accuracy in d eventually depends on the measurement accuracy in wrapped phase $\Delta\varphi$. It is important to design an OCT system with minimized intrinsic phase noises, such as wavelength triggering error and optical frequency clocking errors for the data acquisition system, for this measurement. Environmental phase noises introduced by mechanic vibrations and temperature fluctuations play significant roles in the measured phase stabilities. The optical delay in the reference light generator and the free space optical delay between the measurement probe and the object need to be protected and isolated from the aforementioned environmental phase noise sources.

Transverse Resolution Improvement Method: Close-Loop Control of Beam Focusing in Object Probe The transverse resolution of the OCT system is the beam spot size on the object. Because the object under measurement may have varying surface height, and the optical beam cannot penetrate the object very deep beyond the first a few strong reflections in depth, it is important to keep the optical beam focusing length adjustable near the first or the strongest reflection surface in depth. This task can be accomplished by implementing a close loop control of the beam focusing mechanism in the probe based on the object height measured by the OCT system.

Figure 2:
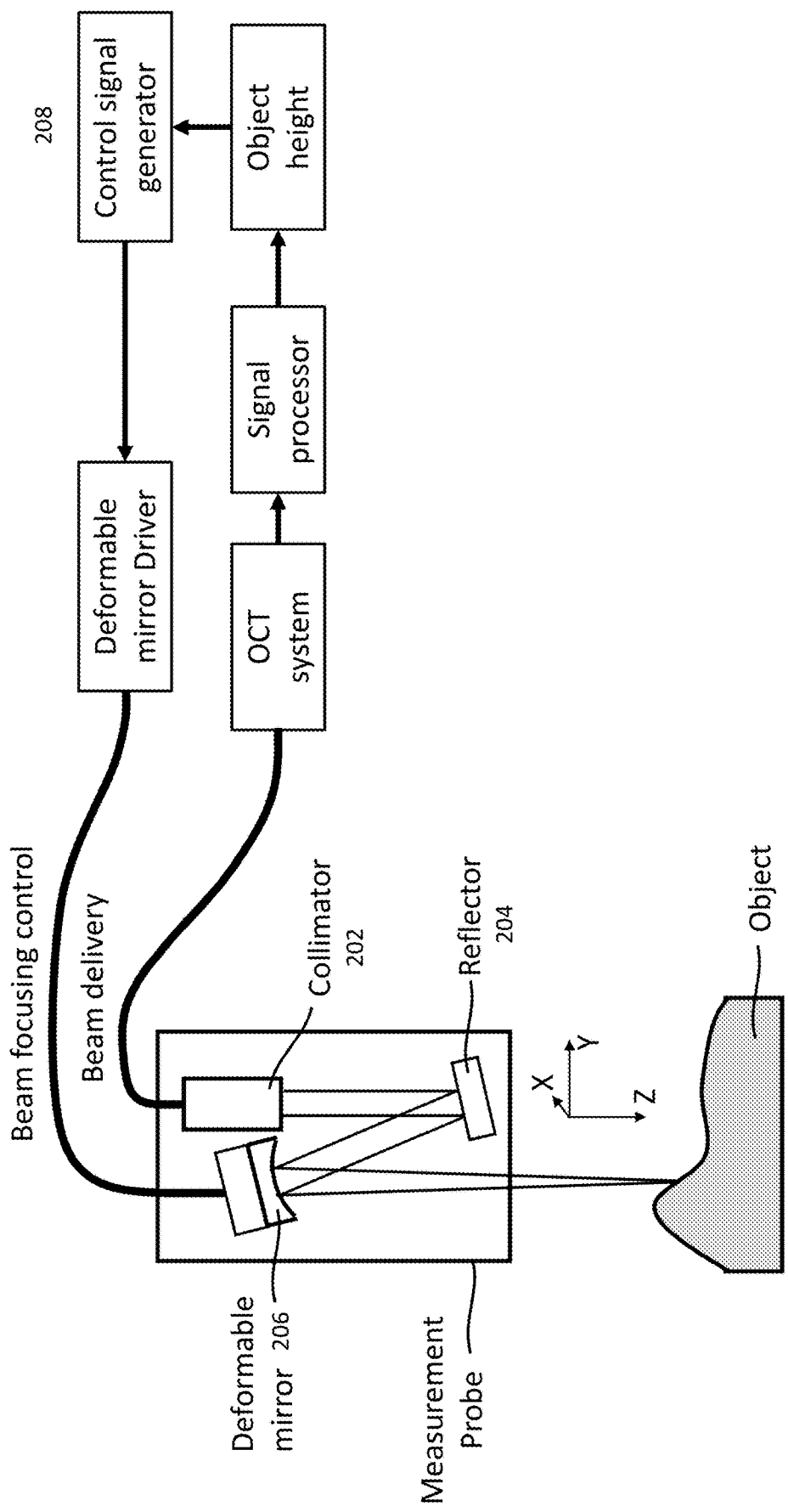
FIG. 2 shows a close-loop control of beam focusing in the measurement probe according to an embodiment.

FIG. 2 shows the block diagram of the close-loop control of beam focusing in the probe. The light source inside the OCT system 110 delivers light to the probe 108. The light is converted into a collimated beam by a collimator 202. The collimated beam is reflected by a reflector 204 onto a deformable mirror 206. The deformable mirror acts as a concave lens with adjustable focusing length to focus the beam at a certain distance. The light back reflected from the object is collected by the same optics inside the probe and detected by the OCT system. The signal processor 112 processes the interference fringe signals of the OCT system to obtain the object depth profile and determine the object height 116. Usually the first or the strongest peak in the OCT depth profile is identified as object height. The measured object height is converted into a control signal for the deformable mirror driver by a control signal generator 208. The deformable mirror driver controls the curvature of the deformable mirror and changes beam focusing distance from the probe, to have the beam always focused near the object surface. In the OCT system, the depth scan is performed at very high speed from kHz to MHz, the transverse scan is performed at slower speed than the depth scan. Because the object surface is continuous, the required speed of the close loop control is typically slower than the depth scan rate.

Figure 3:
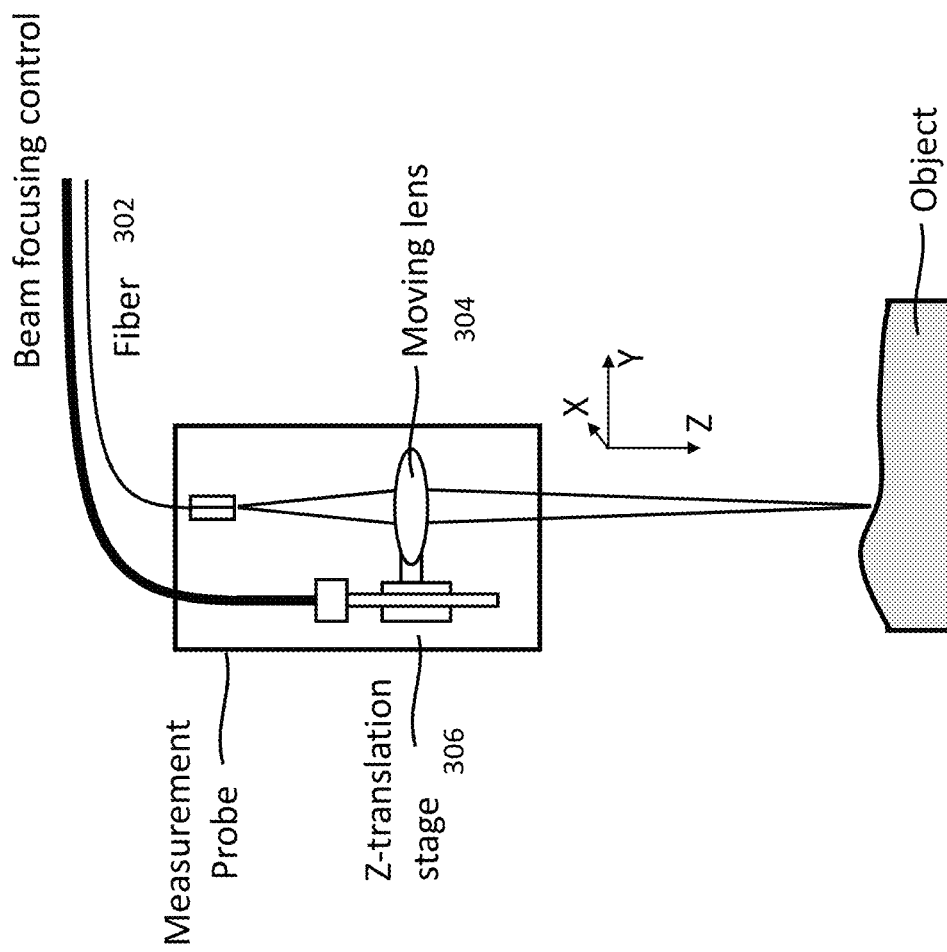
FIG. 3 shows beam focusing control mechanisms in the measurement probe according to an embodiment.

FIG. 3 shows another beam focusing control mechanism. The optical beam delivered to the probe is converted to a point source such as using an optical fiber 302. A moving optical lens 304 is mounted on a translation stage 306 inside the probe and focuses the beam from the point source to a focusing spot outside of the probe. By translating the lens in z direction it is possible to change the distance from the beam focusing to the probe. Alternatively the fiber can be moved to change this distance too, and the optical path length change due to fiber position move needs to be compensated. When the distance between the point source and moving lens is f, where f is the focal length of the lens, it requires increasing the distance by f to reduce the beam focusing point from infinity to 2f. The beam focusing control changes the z-position of the optical lens based on the software measured object height positions. In this design, because the optical beam is always along the optical axis of the lens, it is possible to achieve diffraction limited spot size of the focused beam.

Figure 4:
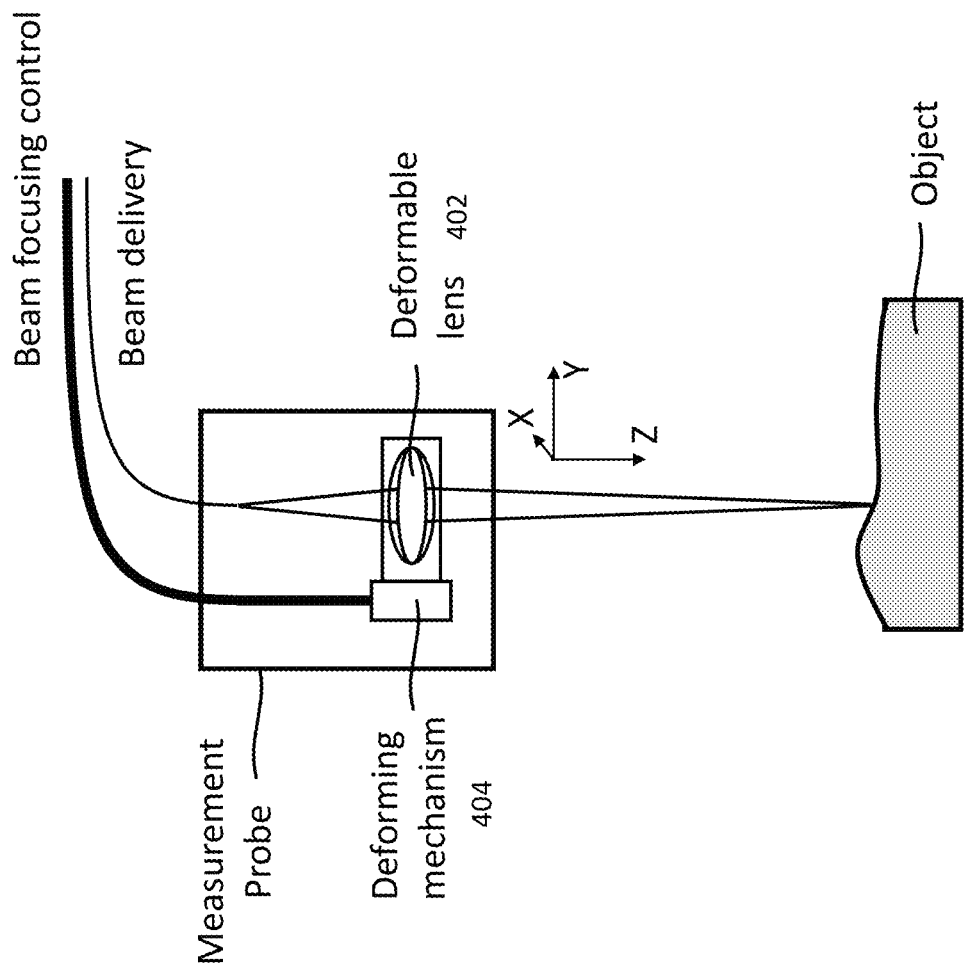
FIG. 4 shows beam focusing control mechanisms in the measurement probe according to an embodiment.

FIG. 4 shows another beam focusing control mechanism. The optical beam delivered to the probe is converted to a point source. A deformable optical lens 402 is mounted in front of the point source to focus the beam into a spot outside of the probe. A lens deforming mechanism 404, such as pressing the soft lens to change is shape, is used to adjust the beam focusing position outside of the probe. The deforming mechanism is controlled by the beam focusing control based on the software measured object height positions.

Figure 5:
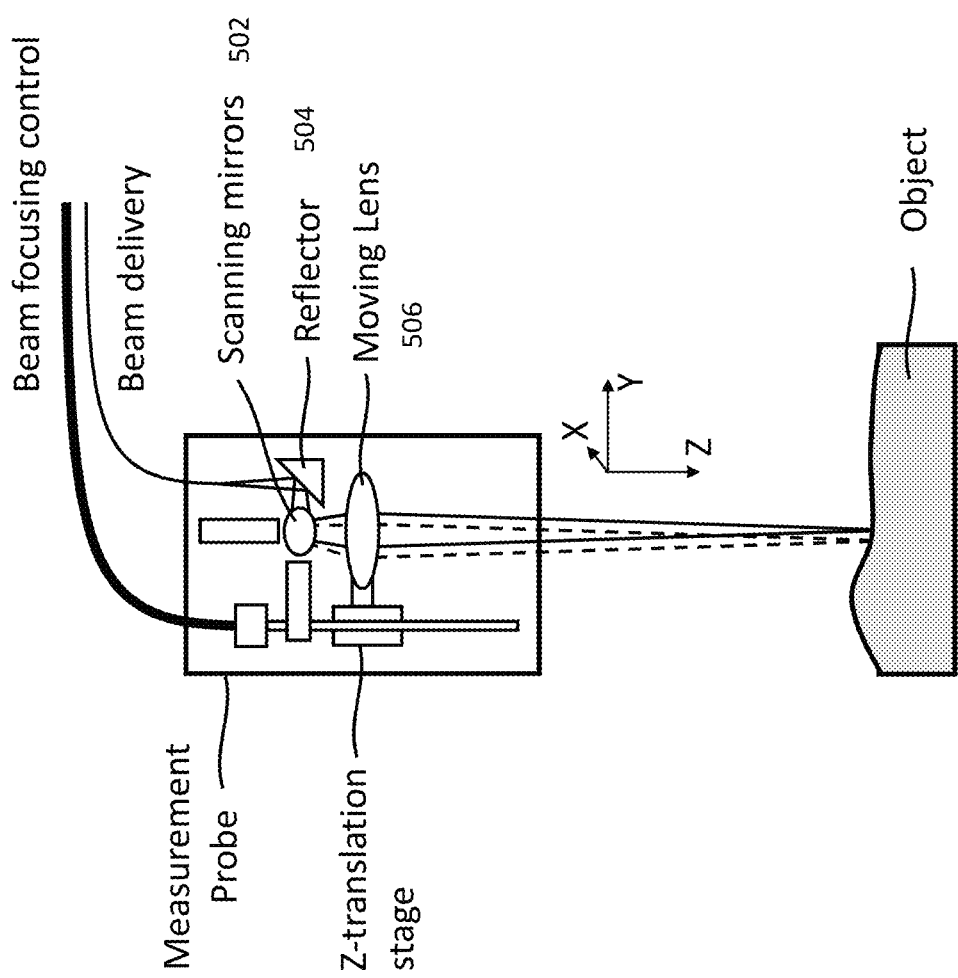
FIG. 5 shows beam focusing control mechanisms in the measurement probe according to an embodiment.

FIG. 5 shows another design of the measurement probe with beam scanning capabilities. The design is similar to that in FIG. 3 except that reflectors 504 and scanning mirrors 502 are inserted into the beam path between the point source and the moving lens 506. The scanning mirrors 502 steer the optical beam into different angle going through the moving lens 506, causing the shift of the focused spot in the horizontal (X and Y) planes. Using fast scanning mirrors such as galvanometer scanners, MEMS scanners or a fast steering mirror, the beam scanning speed can be faster than the X and Y moving speeds of the probe, this scanning measurement probe can achieve faster measurement speed than non-scanning types. In this design, the total optical distance between the point source and the moving lens is changed between f to 2f to change the distance between the beam focus and the moving lens from infinity to 2f. A f-theta lens is usually using in the probe when the beam scanning is required. The residual optical aberrations such as field curvature caused by the f-theta lens need to be corrected.

The benefits of using close-loop control of beam focusing are:
1) Although the object height changes during measurement, the optical beam remain focused on the object with diffraction limited spot size to ensure highest possible transverse resolution of the measurement;
2) There is no need to mechanic moving the probe in Z direction and the depth scan is performed at the scan rate of the OCT system, which eliminates one dimensional moving of the measurement probe.
3) The probe has lighter weight than conventional CMM touch probe with Z direction moving mechanism so the X and Y direction scans of the object can be made at faster speed.

Figure 6:
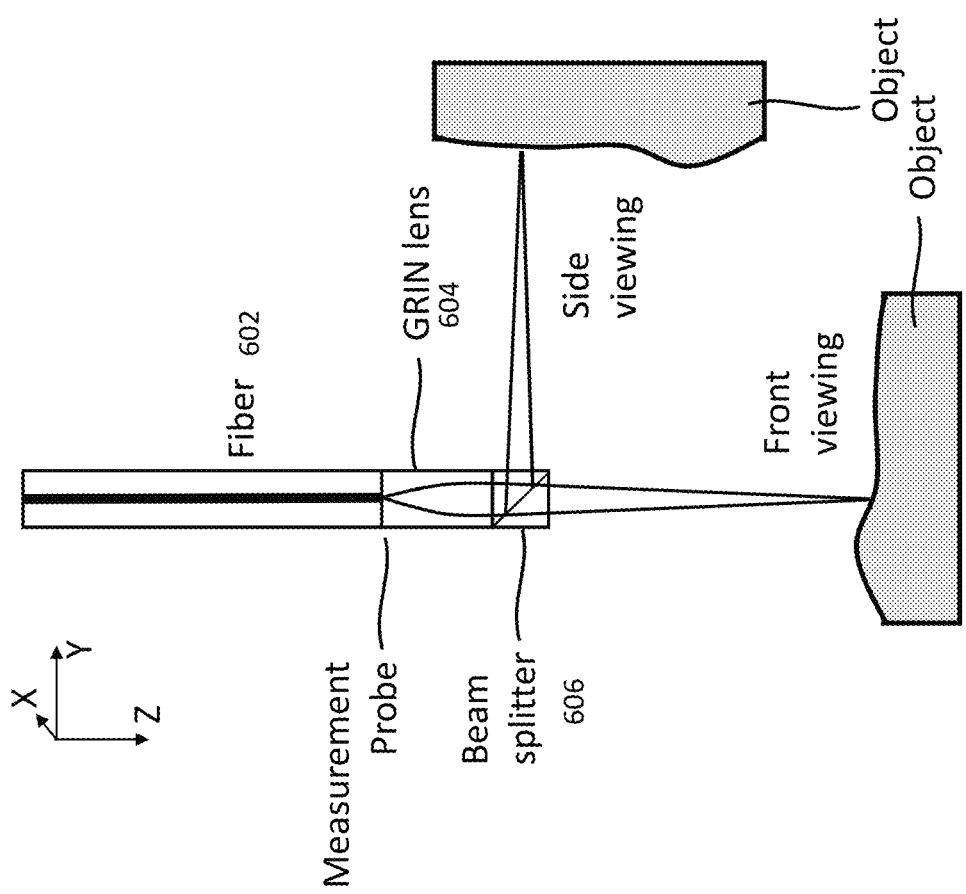
FIG. 6 shows a miniature measurement probe with front viewing and side viewing capabilities according to an embodiment.

FIG. 6 shows a miniature measurement probe for swept source CMM with both front viewing and side viewing capabilities. The measurement probe consists of a fiber 602, a lens 604 and a beam splitter 606 assembled together with total probe diameter similar to the diameter of the fiber. The fiber is a single mode fiber either polarization maintaining type or non-polarization maintaining type. The fiber delivers the light from the OCT system to the probe. The lens is used to focus the light exiting the fiber at a certain distance from the fiber. The lens is a miniature GRIN (gradient refractive index) lens or a ball lens, or other micro-optic lenses. The beam splitter splits the optical beam into two beam paths, one path for front viewing and the other path for side viewing. The beam splitter splits the input beam based on input intensity, wavelength, or polarization. When the beam splitter is an intensity beam splitter, the probe knows which direction the light is coming back from the object, based on previous knowledge about the object. When the beam splitter is a wavelength beam splitter, one portion of the swept source wavelength is used to measure the front objects and the other portion is used to measure the side objects. The signal processer in the OCT system can differentiate these two channels because the interference fringe signals are wavelength encoded. When the beam splitter is a polarization type, the polarization of the light exiting the fiber can be externally controlled to be a linearly polarized, either totally going into the front viewing path or totally going into the side viewing path. A polarization maintaining type fiber is preferred when using a polarization beam splitter in this miniature measurement probe, with the optical axis of the polarization maintaining fiber aligned with one direction of the polarization beam splitter. It is possible to select the probe to be front viewing type or side viewing type by controlling the light polarization in the fiber.

Figure 7:
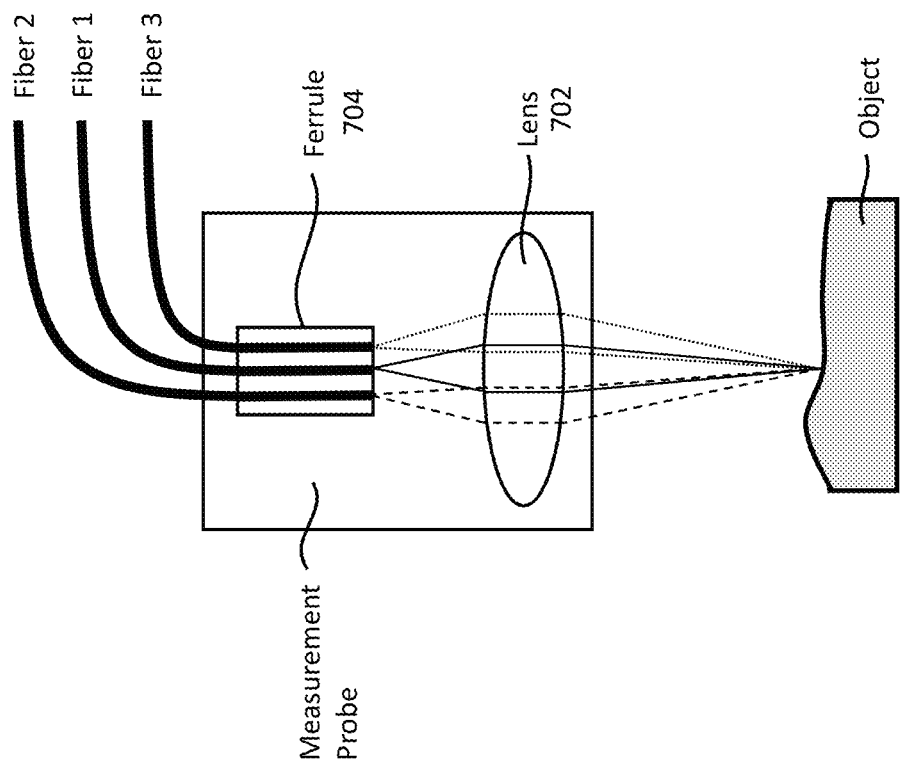
FIG. 7 shows a measurement probe with single fiber for beam delivery and multiple fibers for signal collection according to an embodiment.

FIG. 7 shows a measurement probe with single fiber for beam delivery and multiple fibers for signal collection. In this design, fiber 1 is used to deliver the light from an OCT light source to the object. The light exit fiber 1 is focused by a lens 702 onto the object. The light is back-reflected and back-scattered by the object into different collection angles. Fiber 2 and fiber 3 are arranged in close vicinity of fiber 1 in a fiber ferrule 704 that can hold multiple fibers, with distance between fibers in the same scale as the fiber core size. All three fibers are signal collection fibers to collect the back-scattered light from various scattering angles, using the same lens as collection optics. All fibers are preferably single mode fibers, because light entering multi-mode fibers have multiple optical paths resulting in multiple delays detected by an OCT system. The multiple collection fibers design is especially useful for detecting weak reflections from an object that is being measured. Because all fibers are arranged with distance as the fiber core size, the ferrule is equivalent to a multi-core single mode fiber which can be designed in a fiber manufacturing process. Another method to obtain this multi-core single mode fiber ferrule is through the fiber fusion process, where multiple parallel fibers with buffer layers removed are twisted, stretched and fused together so their cores are very close to each other. The fused multiple fibers are cured by epoxy and protected inside a ferrule to be permanently fixed. The ferrule is cut at where the fiber cores are closest and the cut end surface is polished. Because all fibers are close to each other, any fiber can be used for beam delivery and all fibers can be used for signal collection.

Figure 8:
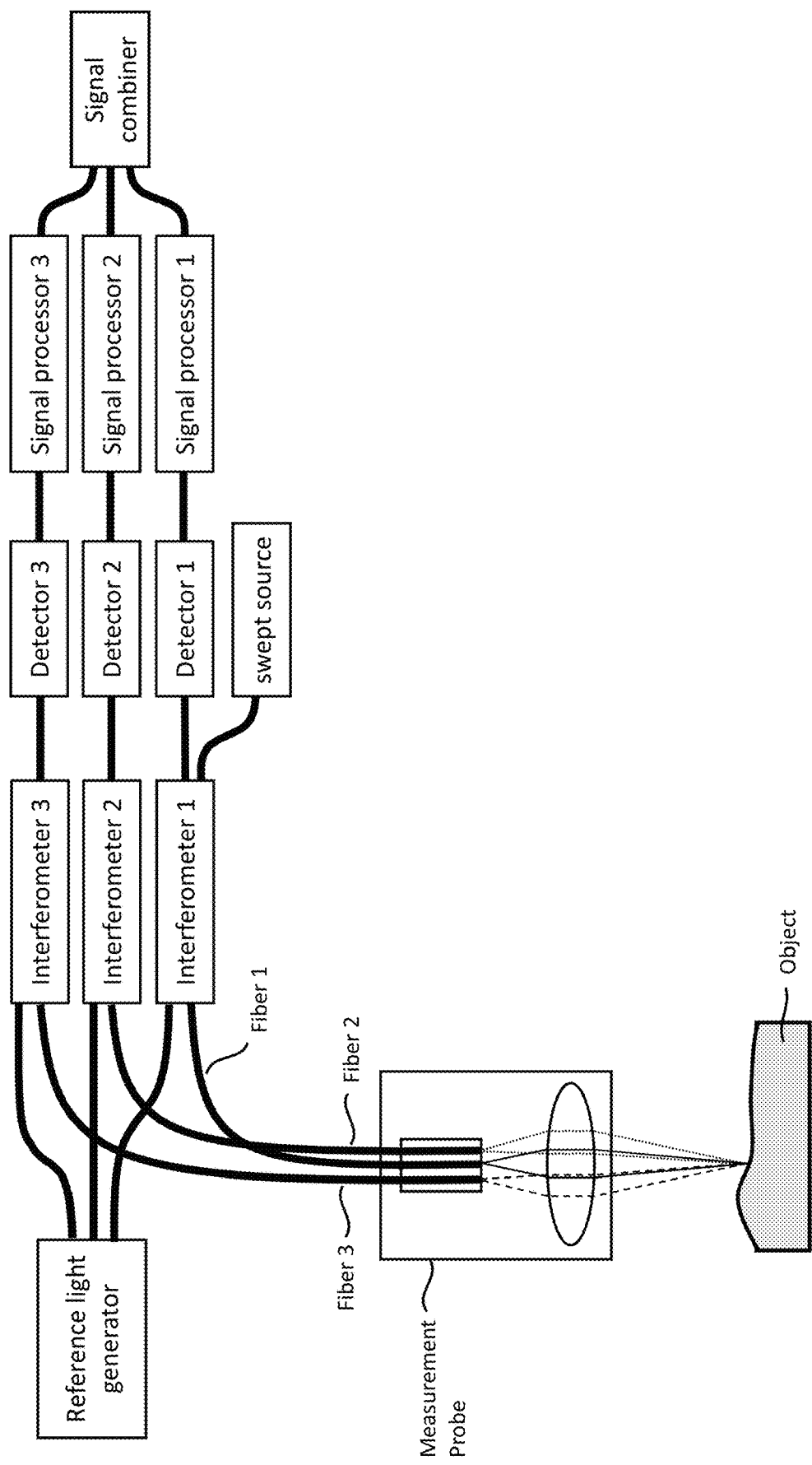
FIG. 8 shows an OCT system supporting one delivery fiber and multiple collection fibers according to an embodiment.

FIG. 8 shows an OCT system supporting multiple fibers for signals collection. The light from a swept source is directed to interferometer 1. Fiber 1 is the beam delivery fiber inside the measurement probe that is connected to interferometer 1. The light back scattered from the object is collected by fiber 1, fiber 2 and fiber 3 that are connected to interferometer 1, interferometer 2, and interferometer 3, respectively. The light from interferometer 1 is also connected to a reference light generator which provides three reference light optical delays, each matching the optical delay of the light from the probe for each interferometer. Each interferometer generates one set of the interference fringe signals recorded by a detector and then processed by a signal processor. One signal processor processes the interference fringe signals to measure the intensity and depth location of the signals back-scattered from the object collected by one fiber. The signals from all three fibers can are processed by three signal processors respectively to obtain three depth profiles. The three depth profiles are sent to a signal combiner which is a mathematical processor for additional processing including depth alignment, adding and averaging, to obtain the final depth profile of the object. In this design, each signal processor has an A/D converter to convert the analog signals from the detector into digital data, processes the digital data using Fast Fourier transform (FFT) to obtain the intensity and phase of the interference fringe signals as a function of measurement depth, to be one depth profile. The processed depth profiles from all interferometers are added together in the signal combiner which is also a digital signal processor to obtain a low-noise, high sensitive depth profile of the object. The high sensitivity comes from the signal-to-noise improvement of the system, because more signal photons are collected in this design than using only one fiber for photons collection.

Figure 9:
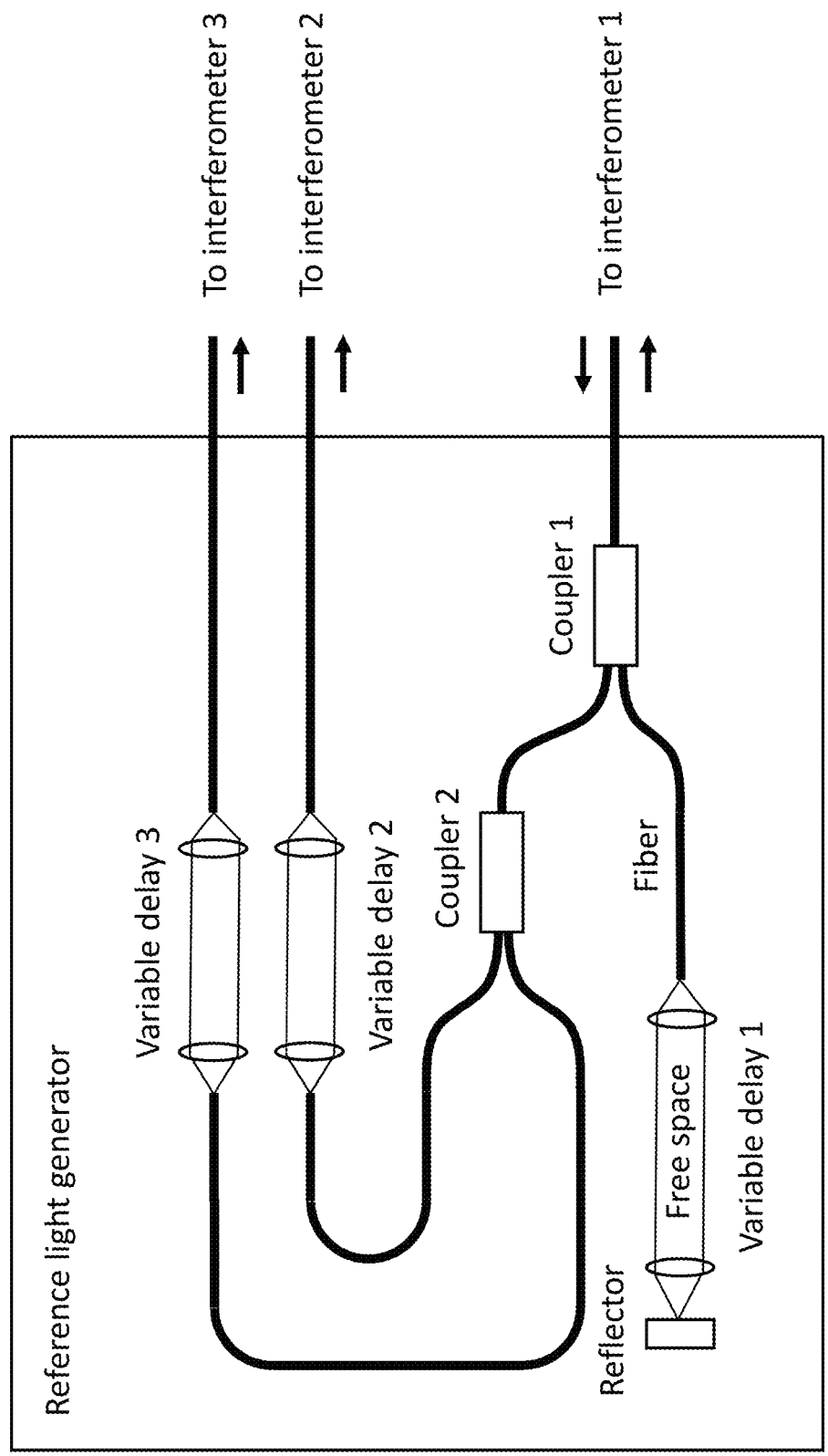
FIG. 9 shows a reference light generator for the OCT system supporting one delivery fiber and multiple collection fibers according to an embodiment.

FIG. 9 shows a reference light generator for the OCT system supporting multiple fibers for signals collection as shown in FIG. 8. The light from interferometer 1 is distributed into three variable delay sections. Variable delay 1 is a reflection type having a reflector reflects the light back into the incoming fiber from interferometer 1, to serve as the reference delay for that interferometer. Variable delay 2 and variable delay 3 are transmission type and transmit the light into two fibers connected to interferometer 2 and interferometer 3 respectively, to serve as the reference delay for these interferometers. All variable delays consist of a collimated optical beam in free space between two lenses. Moving the lens and the fiber at focal point of the lens together changes the optical delay values. This reference light generator has one input fiber from interferometer 1 and generates three independently adjustable optical delays as three outputs, one for each interferometer.

Figure 10:
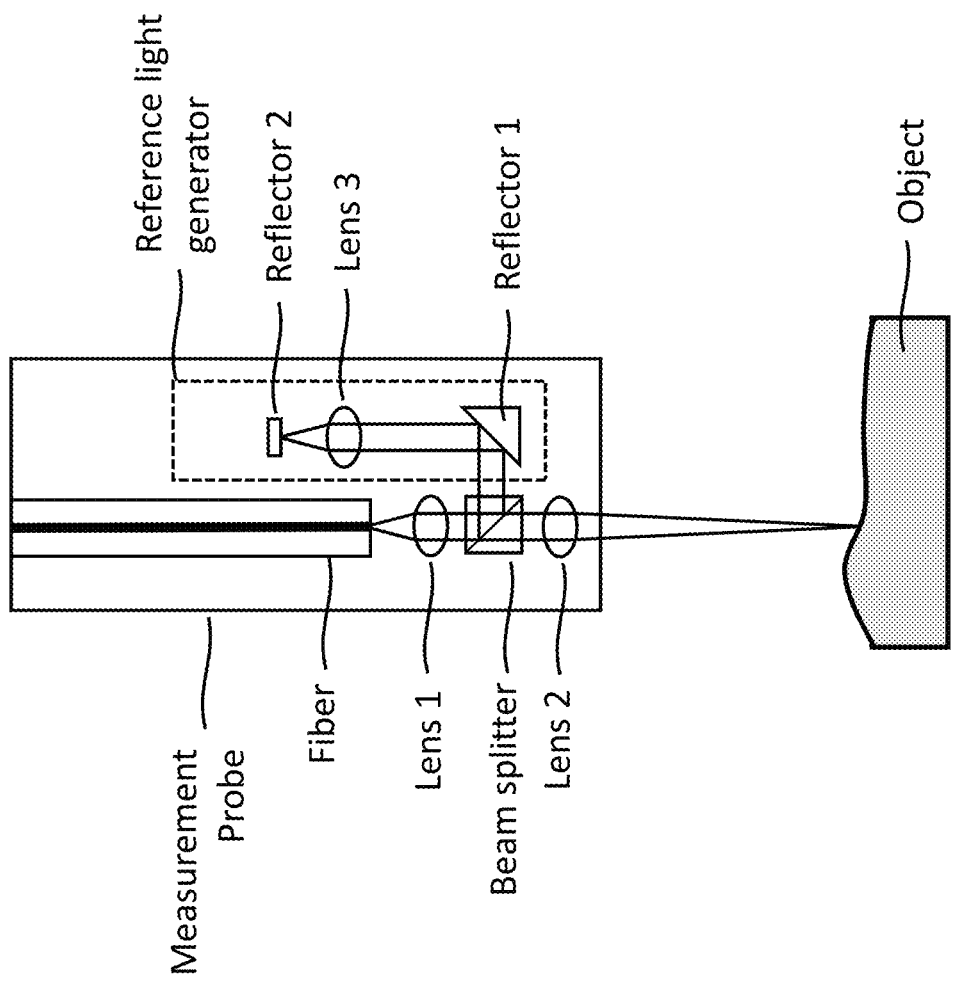
FIG. 10 shows a measurement probe with reference light generator according to an embodiment.

FIG. 10 shows a reference light generator located inside the measurement probe. A single mode fiber is used to deliver the light from the light source to the probe. The light exiting the fiber is collimated by lens 1 and split by a beam splitter. One part of the light after the beam splitter is focused by lens 2 to the object to be measured. Moving lens 2 along the beam path changes the beam focusing condition on the object. The other part of the light after the beam splitter goes into a reference light generator located inside the measurement probe. Lens 3 and reflector 2 in the reference light generator can be moved along the beam path to change its optical delay in the reference reflector 2.

Depth Measurement Range Improvement Method: Close-Loop Control of Optical Delay in Reference Light Generator In a spectral domain OCT system which uses a broadband light source, an interferometer, and a detector consisting of spectrometer with line-scan camera, the depth measurement range is limited by the spatial spectral resolution of the detector. In a swept source OCT system which uses a swept light source, an interferometer and a fast detector, the depth measurement range is limited by the dynamic coherence length of the swept source and the bandwidth of the detector. In both type of OCT systems, when the optical delay to be measured is out of the depth measurement range, the contrast of the interference fringe signals degrades and eventually become not measureable.

For OCT systems use point measurement scheme, where single point on the object is illuminated and measured at a time, when the object has a varying height that is out of depth measurement range of an OCT system, the optical delay in the reference light generator can be changed to shift the object into the measurable region. The measured optical delay value needs to be adjusted by the change of the optical delay in the reference light generator as the accurate height information of the object.

Figure 11:
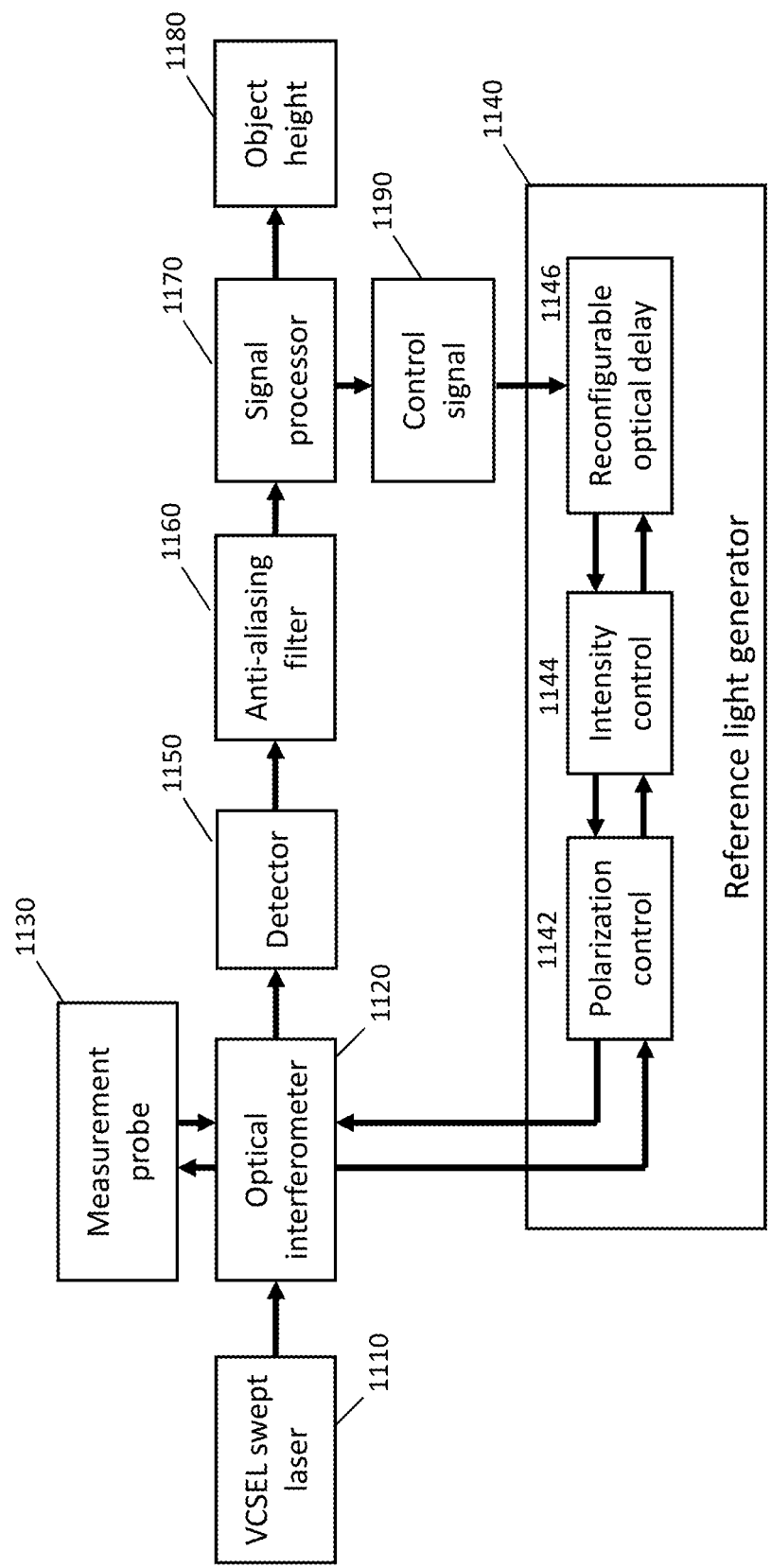
FIG. 11 shows a close-loop control of the optical delay in the reference light generator according to an embodiment.

FIG. 11 shows the diagram of the close-loop control of the optical delay in the reference light generator of an OCT system. Light from a VCSEL swept laser 1110 is directed to an optical interferometer 1120. The optical interferometer splits the light to a measurement probe 1130 and a reference light generator 1140. The reconfigurable reference light generator has an optical path consists of polarization control 1142, intensity control 1144 and reconfigurable optical delay 1146. The light from the measurement probe and the light from the reference light generator interfere in the optical interferometer 1120 and a detector 1150 records the interference fringe signals. The interference fringe signals is filtered by an anti-aliasing filter 1160, which is usually a low pass filter, to fulfill the sampling theorem. A signal processor 1170 processes the filtered interference fringe signals to obtain the depth profile of the object. If no object height is detected from the depth profile, the signal processor generates a control signal 1190 to change the optical delay in the reference light generator, and check the depth profile if an object height 1180 is detected and measured. The measured object height is offset by the amount of optical delay changes as the accurate height information of the object.

Figure 12:
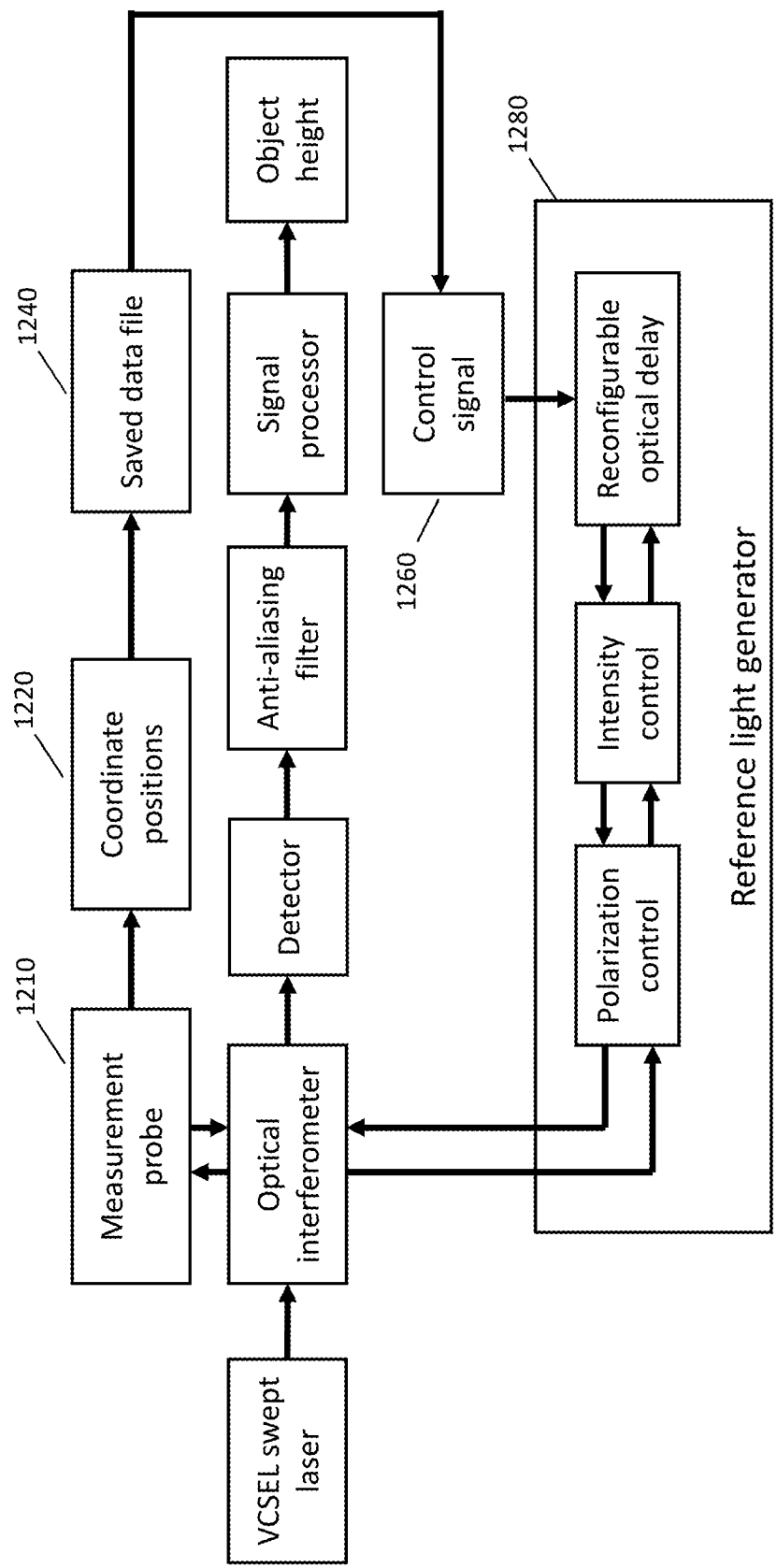
FIG. 12 shows a close-loop control of the optical delay in the reference light generator according to an embodiment.

FIG. 12 shows another diagram of the close-loop control of the optical delay in the reference light generator of an OCT system. The measurement probe 1210 is actuated by its moving mechanism to scan the object and the XY coordinate positions 1220 of the probe can be provided by its moving mechanism. The coordinate positions are used to search a previously saved data file 1240 to generate a control signal

1260. The previously save data file contains information about the geometric information of the object, that is obtained from a previous measurement or previous knowledge about the object such as its design information. The control signal is used to change the optical delay in the reference light generator 1280. The measured object height is offset by the amount of optical delay changes as the accurate height information of the object.

Figure 13:
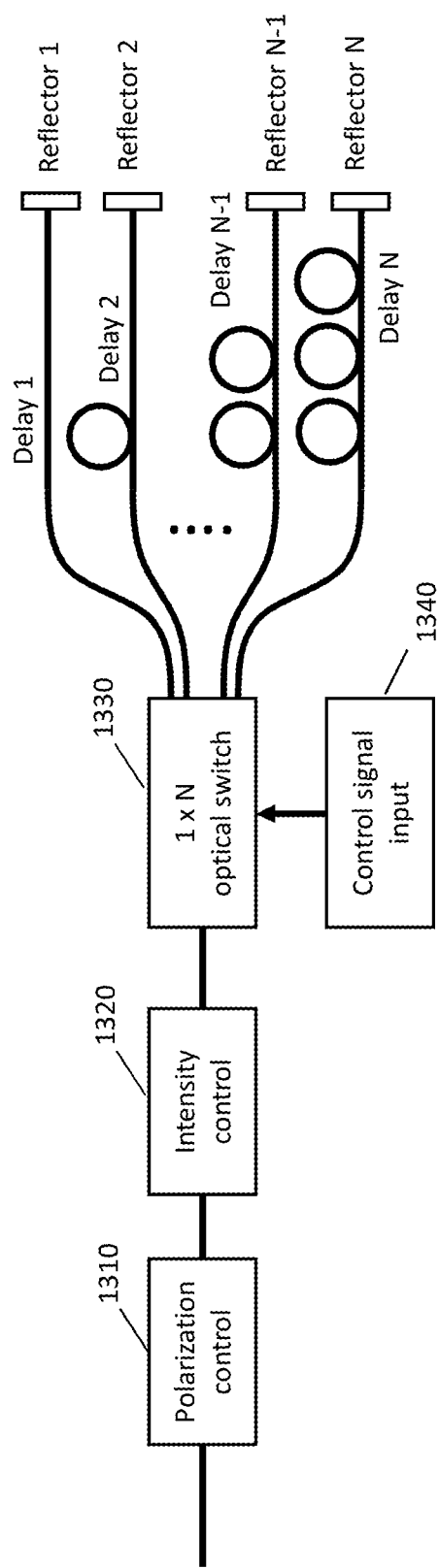
FIG. 13 shows a reference light generator with reconfigurable optical delay according to an embodiment.

FIG. 13 shows one reference light generator with reconfigurable optical delay. The light passes the polarization control 1310 and intensity control 1320 to a 1×N optical switch 1330. There are total N number of optical paths after the 1×N optical switch, and each optical path has a different optical delay with a reflector at the end of the optical path. The control signal 1340 is applied to 1×N optical switch to select one of the N optical paths for the light to enter, and reflected back by a reflector at the end of the optical path. Therefore, the optical delay in the reference light generator can be reconfigured into total N discrete numbers. Because an optical switch can perform fast switching of the optical signals with switching time less than 1 microsecond, it is ideal for fast reconfiguration of the optical delay in the reference light generator, to compensate for object height changes.

Figure 14:
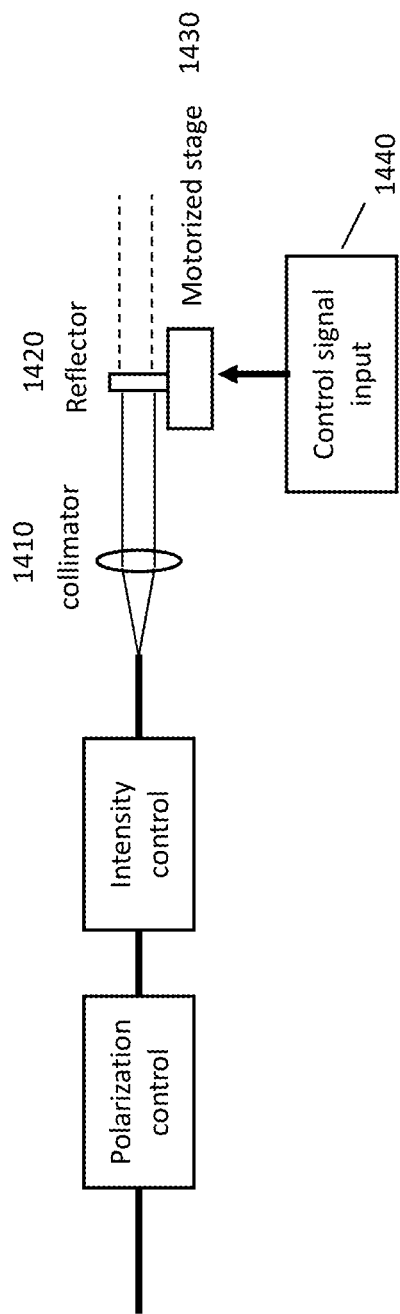
FIG. 14 shows a reference light generator with reconfigurable optical delay according to an embodiment.

FIG. 14 shows another reference light generator with reconfigurable optical delay. The light passes the polarization control and intensity control to a collimator. The beam is collimated after the collimator 1410, propagates a distance, and is reflected by a reflector 1420. The reflector is mounted on a motorized stage 1430 that can change its position along the beam path. The control signal 1440 is applied to the motorized stage and changes the optical delay in the reference light generator. This mechanism is relatively slow because it needs to move a reflector over a long distance along the beam path.

Figure 15:
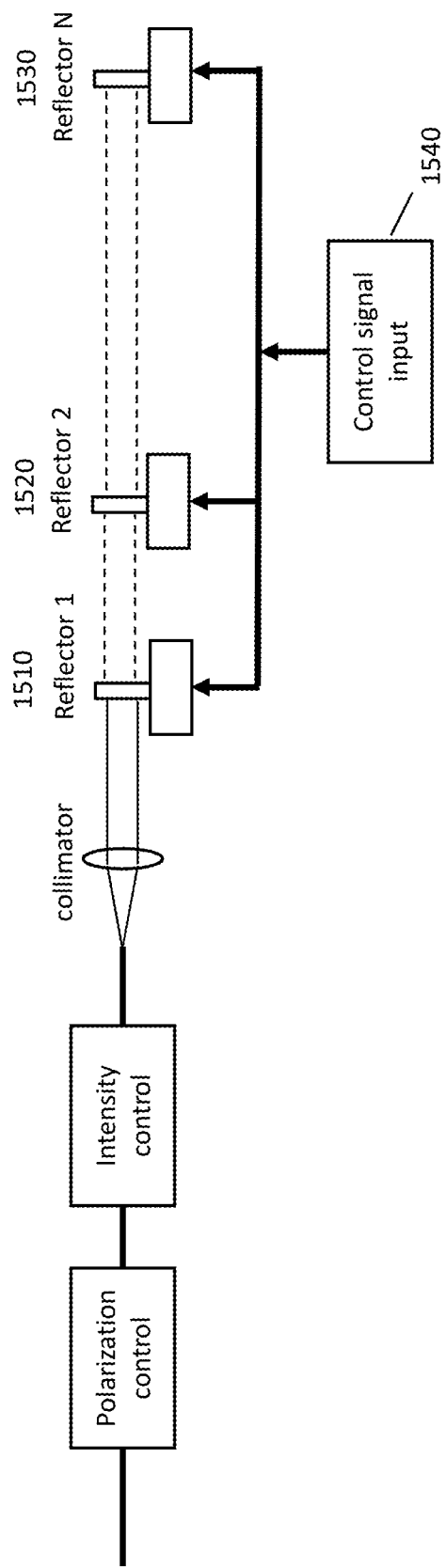
FIG. 15 shows a reference light generator with reconfigurable optical delay according to an embodiment.

FIG. 15 shows another reference light generator with reconfigurable optical delay. The light passes the polarization control and intensity control to a collimator. The beam is collimated after the collimator, propagates a distance, and is reflected by one of a series of reflectors 1510, 1520, 1530 arranged along the beam path. The control signal 1540 is applied to all the reflectors. Any reflector can be moved in and out of the beam path, to allow the light to be reflected from one reflector or any of its following reflectors along the beam path.

Depth Measurement Range Improvement Method: Duel Operation Modes With Dynamic Reference Delay Adjustment MEMS tunable VCSELs are manufactured using wafer scale fabrication techniques, so the greatly improved speed and resolution of the measurement, compared to conventional CMM with touch-trigger probe, do not come at high cost. The gain material is optically pumped or electric pump. The laser cavity is formed by the gain material located between two end mirrors. One end mirror is stationary. The other end mirror is suspended by a flexible structure and is called the MEMS mirror. The total cavity length of the MEMS tunable VCSEL is about a few microns, which is on the order of the output wavelength that the laser cavity can generate. Applying voltage across actuators creates an electrostatic attractive force to change the position of the MEMS mirror, thereby altering the cavity length and tuning the laser output wavelength. Because of the MEMS mirror is responsive to a voltage driving signals, it is possible to design various driving waveforms for different speed and spectral tuning range for the same MEMS tunable VCSELs to operate at. The MEMS tunable VCSEL is a highly reconfigurable swept source whose speed and spectral tuning range are both reconfigurable.

With the flexibility in the MEMS tunable VCSEL, a swept source OCT system can be quickly reconfigured to work in different modes in time. The measurement results obtained in different operation modes can be utilized and combined to achieve the speed, resolution and depth range performances that are not possible to achieve in only one operation mode:

The two operation modes of the MEMS tunable VCSEL are:

1. A low resolution mode using reduced depth resolution to measure the object height information over a large depth range. This is a pre-scan of the object to generate an approximate object height within the full depth measurement range that can be supported by the detection system. This pre-scan can be done at fast sweep rate of the swept source to save time.
2. A high resolution mode using full spectral bandwidth of the laser and the best depth resolution. The optical delay in the reference light generator is adjusted using the approximate object height to reduce the required detection bandwidth.

Figure 16:
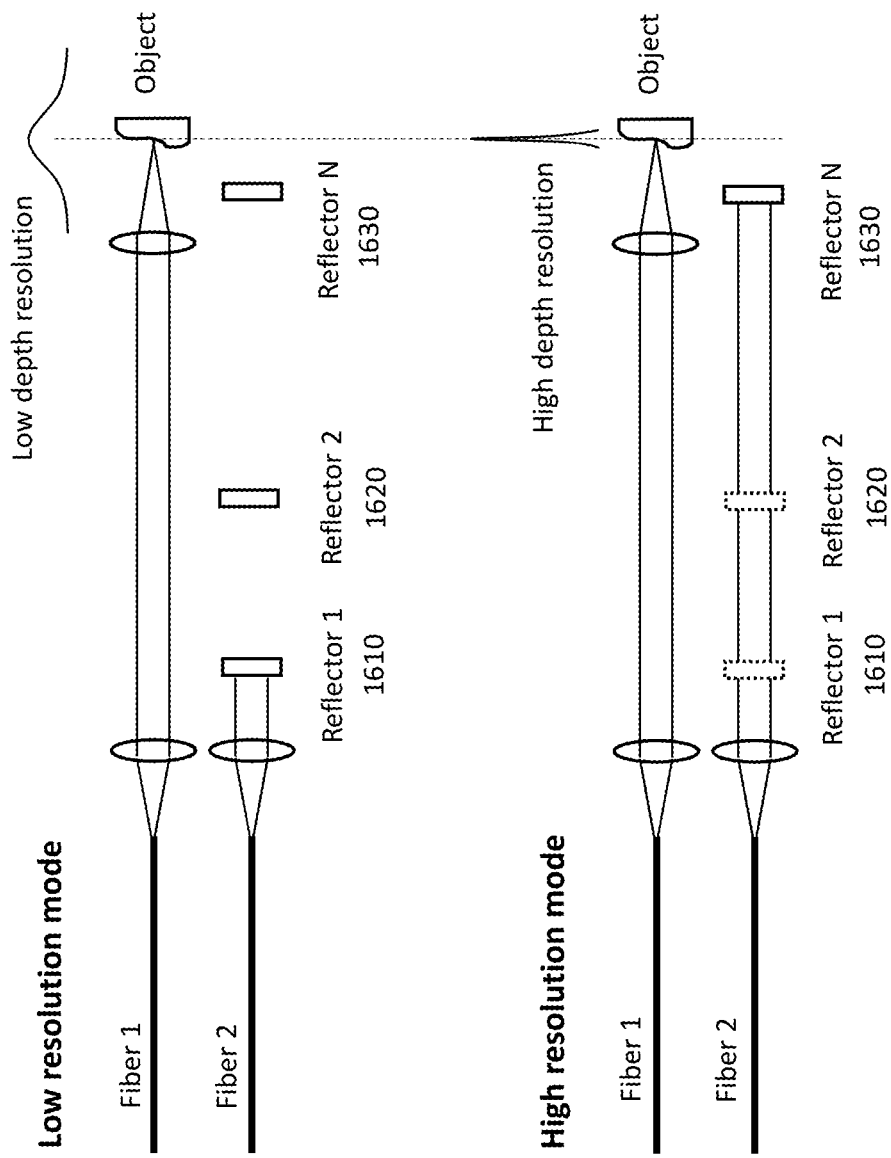
FIG. 16 shows dual operation modes with dynamic optical delay adjustment in the reference light generator according to an embodiment.

FIG. 16 shows the two operation modes of the swept source that are combined to achieve high depth resolution over extended depth measurement range. Fiber 1 located in the measurement probe delivers the light to an object. Fiber 2 in the reference light generator delivers the light to a reflector that is at the beginning position (reflector 1) 1610 of a series of reflectors 1610, 1620, 1630. The swept source output wavelength range is reduced to find the object height information with low depth resolution. This is the low resolution mode and an approximate object height is obtained. The system then operates in the high resolution mode for the swept source to output its full wavelength tuning range, and a reflector 1630 which provides an optical delay most close to the approximate object height is selected in the reference light generator. The interference fringe signals generated by the object reflection and the selected reflector now have the lowest frequency bandwidth requirement for the detection system.

To measure the object height at different coordinate locations, the system performs a low depth resolution scan of the object, and save the approximate object height at each coordination location into a memory device. When the system performs the high resolution scan of the object, at each coordinate location, the approximate object height is read from the memory device and the optical delay that mostly matches the object height in the reference light generator is selected. This close-loop control of optical delay is depicted in FIG. 12. The object height is the measured object height in high depth resolution mode adjusted by the changes made to the optical delay in the reference light generator.

Major benefits for a swept source system to have dual operation modes with dynamic reference delay adjustment are:

1. To allow a detection system with limited detection bandwidth to measure extended depth range, without scarifying the depth resolution of the measurement.
2. After a quick low resolution scan, the user can select a region-of-interest to perform a high resolution scan of the object, without measuring other regions that is not interesting to the measurement. This can save considerable measurement time.

In a spectral domain OCT system, the dual operation modes can be realized by designing two spectrometers optimized for different source bandwidth configurations. One spectrometer is designed to measure a reduced spectral bandwidth of the broadband source, using a highly dispersive diffraction grating to achieve very fine spectral resolution for the reduced spectral bandwidth, to measure the spatial encoded interferogram. The OCT system uses this spectrometer in its low depth resolution mode. The other spectrometer is designed to measure the full spectral bandwidth of the broadband source, using a less dispersive diffraction grating to measure the full bandwidth of the interferogram with less spectral resolution. The OCT system uses this spectrometer in its high depth resolution mode. The object height is the measured object height in high depth resolution mode offset by the changes made to the optical delay in the reference light generator.

Speed Improvement Method: Swept Source CMM With Multiple Measurement Probes

Figure 17:
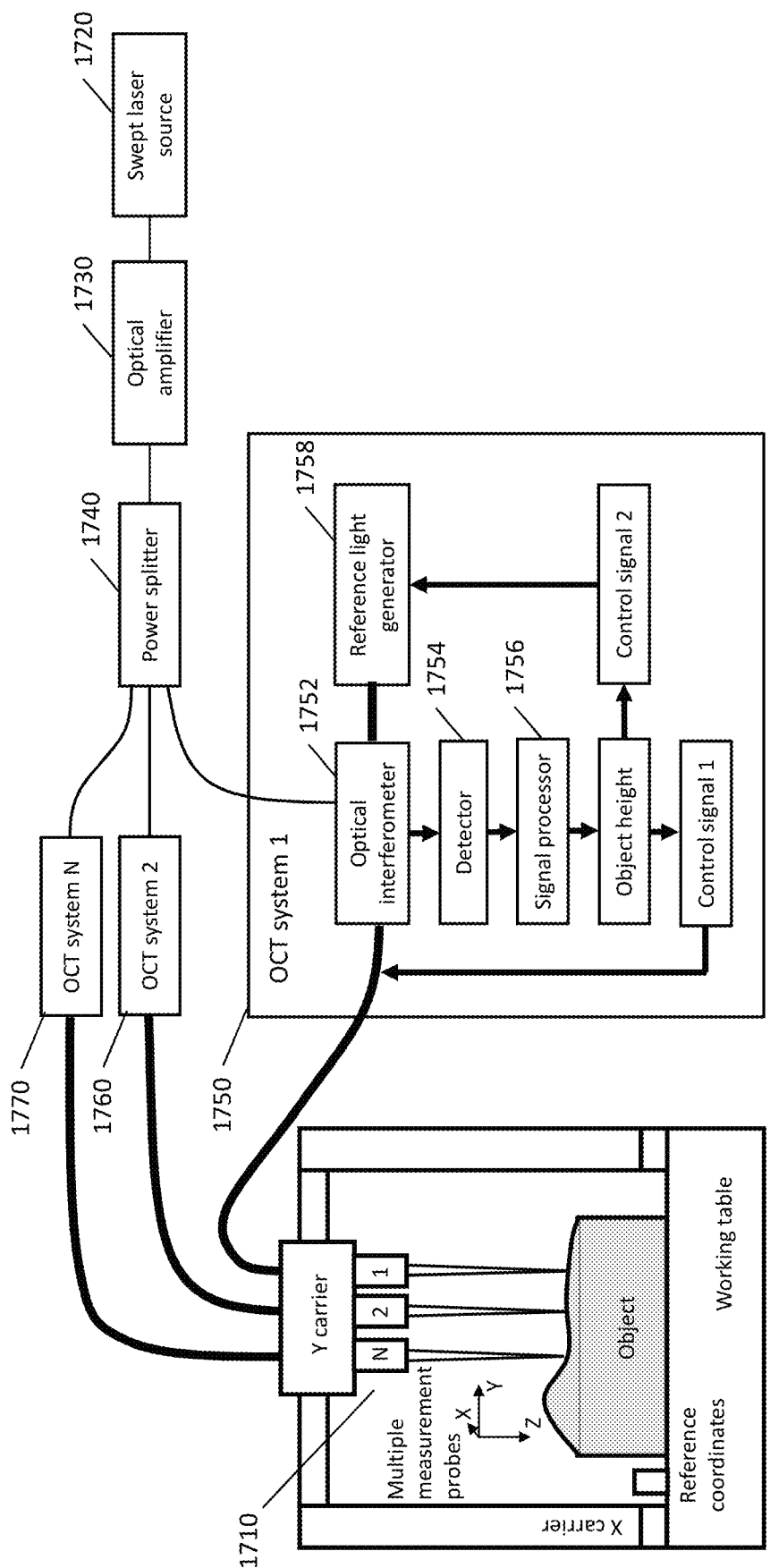
FIG. 17 shows multiple measurement probes to reduce the total measurement time according to an embodiment.

FIG. 17 shows a swept source CMM system equipped with multiple measurement probes 1710. This system is capable of measuring object height at multiple locations simultaneously. The light from one swept laser source 1720 is amplified by an optical amplifier 1730 to boost the output optical power. The amplified optical power is split by a power splitter 1740 and is sent to various OCT systems 1750, 1760, 1770. Each OCT system includes an optical interferometer 1752 connected to a reference light generator 1758 and a measurement probe, a detector 1754 and a signal processor 1756. The signal processor processes the interference fringe signals generated from the optical interference of the light from the measurement probe and the light from the reference light generator, to obtain the object height information. The object height information is used to generate a control signal 1 to control the beam focusing condition in the measurement probe, to improve the transverse resolution of the measurement. The object height information is used to generate another control signal 2, to control the optical delay in the reference light generator to reduce the signal bandwidth in the detection and to extend the depth measurement range.

Swept Source CMM With Adaptable Virtual Optical Stylus

Figure 25:
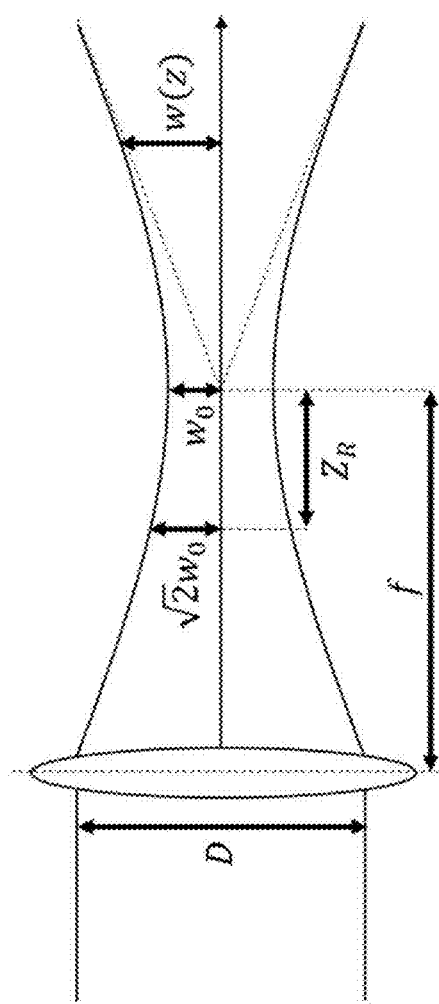
FIG. 25 shows the basic parameters defined in Gaussian beam optics.

A scanning optical probe is one of many possible configurations, for example an Atomic Force Microscope (AFM) is a well-known member of the Scanning Probe Microscope (SPM) family. In the first example configuration the system is designed for the optical beam to operate like a virtual stylus on a coordinate measurement machine (CMM). The optical beam of the swept source can be shaped by some optical elements (i.e. lenses) to form a waist of different diameters and length. The Engineering Object of interest is scanned using a certain scanning scheme. Before proceeding with this example a brief review of Gaussian beam optics as shown in FIG. 25 is provided.

For Gaussian beams, the beam waist w is the radius at which the light intensity has decreased to $1/e^2$ (0.135) of its peak value. The beam waist $w_0$ is the beam size at the focal point given by:

$$w_0 = \frac{4\lambda}{\pi} \cdot \frac{f}{D} \quad \text{(Eq. 18)}$$

where f is the focal length of the lens and D is the input beam diameter on the lens.

The Rayleigh length $Z_R$ is defined as the distance from the waist to the point at which the laser diverges to a diameter of $\sqrt{2}w_0$, and $Z_R$ is determined by the waist radius $w_0$ and the wavelength of the laser:

$$Z_R = \frac{\pi w_0^2}{\lambda} \quad \text{(Eq. 19)}$$

To achieve a 300 µm focused beam diameter as the transverse resolution for a λ=1.0 µm laser with bandwidth of Δλ=60 nm, a beam waist radius of $w_0$=106 µm is required. The 300 µm focused beam diameter is maintained over a depth range of $2Z_R$=70.6 mm as calculated below:

$$2 \cdot \sqrt{2}\, w_0 = 300 \text{ µm}, \; w_0 = 106 \text{ µm}$$

$$2Z_R = \frac{2\pi w_0^2}{\lambda} = \frac{2 \cdot 3.14 \cdot (106 \times 10^{-6})^2}{1.0 \times 10^{-6}} = 70.6 \text{ mm}$$

If the incoming beam diameter is D=1.0 mm, the focusing length of the lens is calculated using Eq.1:

$$f = \frac{\sqrt{2}\, w_0 \cdot D}{1.22 \cdot \lambda_0} = 123 \text{ mm}$$

Here an example where the laser beam is shaped to provide 300 µm transverse resolution over an approximately 31.4 mm depth range is provided. The transverse resolution can be understood as the diameter of the focused beam to measure a reflective surface. The depth resolution is about 8 um given by Eq. 3 does not change with beam focusing conditions.

Returning to this example it is assumed that the laser beam has been shaped to provide the beam just described. The focused OCT beam functions as a virtual optical stylus for the new swept source CMM (SS-CMM) instrument, providing 0.2 mm measurement diameter over 31.4 mm depth range, with 8 um depth resolution. A series of non-contact probes equivalent to those currently provided by many CMM probe manufacturers can be designed.

TABLE 2

Conventional contact type stylus vs. Non-contact optical stylus (with focusing)

| Conventional contact type stylus | | | | Non-contact Optical stylus (with focusing) | | | | | | |
|---|---|---|---|---|---|---|---|---|---|---|
| Manufacturer (Model) | Diameter (mm) | Material | Shape | Diameter (mm) | Beam waist (μm) | Rayleigh length (mm) | Stylus length (mm) | Lens focusing length (mm) | Input beam diameter (mm) | Shape |
| Renishaw (A-5000-7800) | 0.3 | Ruby | Ball | 0.3 | 106 | 35.3 | 70.6 | 123 | 1.0 | Rod |
| Renishaw (A-5000-7813) | 0.1 | Tungsten carbide | Cone | 0.1 | 35 | 3.9 | 7.8 | 123 | 3.0 | Rod |
| Fowler (54-772-301) | 1.0 | Ruby | Ball | 1.0 | 354 | 392.7 | 785.4 | 2460 | 6.0 | Rod |
| Hexagon (03969402) | 2.0 | Ruby | Ball | 2.0 | 707 | 1570.8 | 3141.6 | 2460 | 3.0 | Rod |
| Not Available | 0.05 | Not Available | Not Available | 0.05 | 18 | 1.0 | 2.0 | 123 | 6.0 | Rod |

Above table shows the same design method as shown in the example can be used to design an OCT virtual optical stylus. The design results are:

1) Stylus diameter from 0.1 mm to 2.0 mm can be achieved for an optical stylus, matching the diameters of some conventional contact type styli on the market today.
2) An optical stylus can achieve 0.05 mm diameter currently not available on any conventional contact type stylus on the market.
3) Using the same lens with focusing length of 123 mm, the diameter of an optical stylus can be varied from 0.3 mm to 0.05 mm, by changing the input beam diameter, so the optical stylus can be dynamically re-configured during the measurement, saving the time of switching multiple mechanic probes.

The length of an optical stylus is the length over which the diameter of the optical beam is within its specification. Mathematically this length equals two times the Rayleigh length of the focused beam. A conventional stylus uses a ball shape tip attached to a probe and the length of the stylus is length minus the Rayleigh length of the focusing beam. A long length optical stylus allows the probe to measure deep holes.

To generate a virtual optical stylus with diameter less than about 0.5 mm, one method is to use a single mode fiber to deliver the light as from a point source, and use one lens or a lens system formed by multiple lenses to convert the light from the point source into a collimated beam, by positioning the point source near the front focus point of the lens or the lens system, then use another lens or another lens system to focus the beam into the desired beam diameter.

For stylus diameter larger than about 1 mm, the required lens focusing length increases significantly. The lens focusing length is typically the working distance of an optical probe. For applications requiring shorter working distance and large stylus diameter, an alternative design method is to use a collimated beam to measure the object without focusing the beam. The collimated beam is also a Gaussian shape beam with various parameters. The working distance of the stylus can be reduced to be shorter than the Rayleigh length of the Gaussian beam.

TABLE 3

Conventional contact type stylus vs. Non-contact optical stylus (without focusing)

| Conventional contact type stylus | | | | | Non-contact optical stylus (without focusing) | | | | | |
|---|---|---|---|---|---|---|---|---|---|---|
| Manufacturer | Model | Diameter (mm) | Material | Shape | Beam Diameter (mm) | waist (μm) | Rayleigh length (mm) | Stylus length (mm) | Material | Shape |
| Fowler | 54-772-301 | 1.0 | Ruby | Ball | 1.0 | 354 | 392.7 | 785.4 | Virtual | Rod |
| Hexagon | 03969402 | 2.0 | Ruby | Ball | 2.0 | 707 | 1570.8 | 3141.6 | Virtual | Rod |
| Renishaw | A-5004-0422 | 3.0 | Ruby | Ball | 3.0 | 1061 | 3534.3 | 7068.6 | | Rod |
| Renishaw | A-5003-0049 | 5.0 | Ruby | Ball | 5.0 | 1768 | 9817.5 | 19634.9 | Virtual | Rod |
| Renishaw | A-5003-5239 | 10.0 | Ruby | Ball | 10.0 | 3536 | 39269.9 | 78539.8 | Virtual | Rod | the diameter of the ball without moving the probe. An optical stylus has a rod type tip whose length is determined by the beam focusing condition. When the optical stylus has an optical contact with the object to be measured, a portion of the light energy is reflected and the reflection location is measured by the OCT system. Because the working distance of the optical stylus is defined as the distance between last optics and the first surface of the object, the minimum working distance for above optical stylus is the lens focusing Renishaw Technical Specifications H-1000-3200-16-A titled "Styli and accessories" recommends: "Keep styli short" and "The more that a stylus bends or deflects, the lower the accuracy. Probing with the minimum stylus length for your application is the best option." When using OCT virtual stylus to measure an object is also recommended to keep the working distance as short as possible to minimize phase noise in OCT fringe signals caused by environmental changes such as mechanic vibrations and temperature fluctuations.

In above examples the stylus of the CMM touch probe is replaced with the virtual OCT non-contact optical stylus while maintaining the major features of the touch probe. Thus allowing the same work flow as existing CMM machines on the market.

The CMM Robot will position the laser delivery measurement probe such that the beam waist is placed near the surface of the Engineering Object. The advantage of the SS-CMM is in the ability to respond to large variations in the geometry of the Engineering Object. The SS-CMM would also provide a means to reconfigure the shape of the laser beam so as to provide an on-the-fly change of the optical stylus.

Currently if a deep hole or a recess too small to access is encountered, a stylus change would likely be required, as operating with a very long stylus isn't recommended. Therefore, conventional CMM machines have mechanisms for physically changing the stylus in this system either manually or automatically. The SS-CMM does not change the stylus physically but changes the shape of the stylus by reconfiguring the optics that controls the focused beam.

With this optical solution the effect shape of the stylus can be automatically reconfigured with the OCT enabled non-contact probe. It is anticipated that within the SS-CMM probe there would be support for automatic reconfiguration of the shape of the laser beam being used. This reconfiguration would allow trading off a high NA, short Rayleigh length, small $2\sqrt{2}w_0$ waist for a larger $2\sqrt{2}w_0$ waist that offers a more slowly diverging laser beam that can access deep holes and voids that require special contacting stylus. The benefits are both greater high speed adaptability and improved accuracy and precision of the measurements.

For optical stylus diameter less than about 0.5 mm, a focused beam scheme can be used. For optical stylus diameter larger than about 1.0 mm, a collimated beam scheme can be used.

Figure 18:
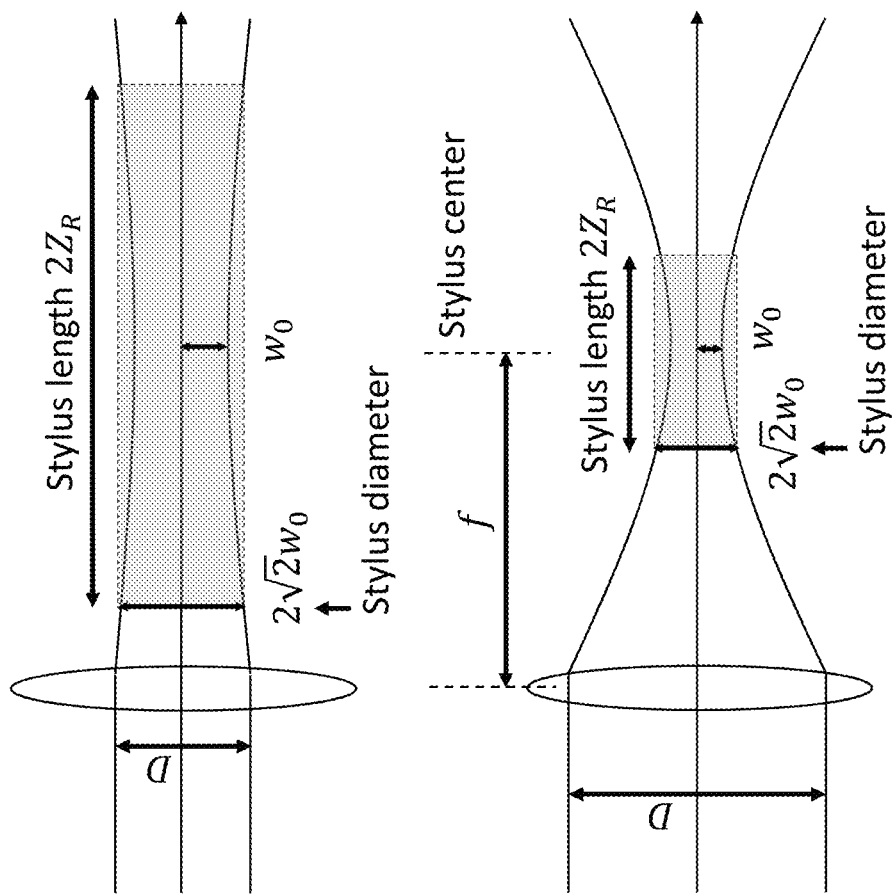
FIG. 18 shows an OCT stylus diameter reconfigured by changing the input beam diameter according to an embodiment.

FIG. 18 shows a method to reconfigure the shape of an optical stylus by changing the diameter of the input beam on the focusing lens, using focused beam scheme. The diameter $D_{stylus}$ and length $L_{stylus}$ of the optical stylus are:

$$D_{stylus} = 2\sqrt{2}\, w_0 = \frac{8\sqrt{2}\lambda}{\pi} \cdot \frac{f}{D} \quad \text{(Eq. 20)}$$

$$L_{stylus} = 2Z_R = \frac{2\pi w_0^2}{\lambda} = \frac{32\lambda f^2}{\pi D^2} \quad \text{(Eq. 21)}$$

Changing input beam diameter D is the preferred method to change the optical stylus shape, because it does not change the center position of the stylus, which is the beam waist position, relative to the lens. The distance from the optical stylus center to the lens is the focal length f.

When the optical stylus is used to measure an object, the object is placed near the optical stylus center and the optical stylus is in optical contact with the object. The term "optical contact" means a portion of the light inside the optical stylus interacts with the object and changes the propagation directions. The reflected and scattered light propagates in the opposite direction and some of the light is collected by the beam delivering optics. The object does not need to be placed exactly at the optical stylus center and only needs to be covered within the length of the optical stylus. If the OCT system detects that the object is outside of the optical stylus region, the optics inside the measurement probe will be reconfigured to change the optical stylus center to match the object height.

Figure 19:
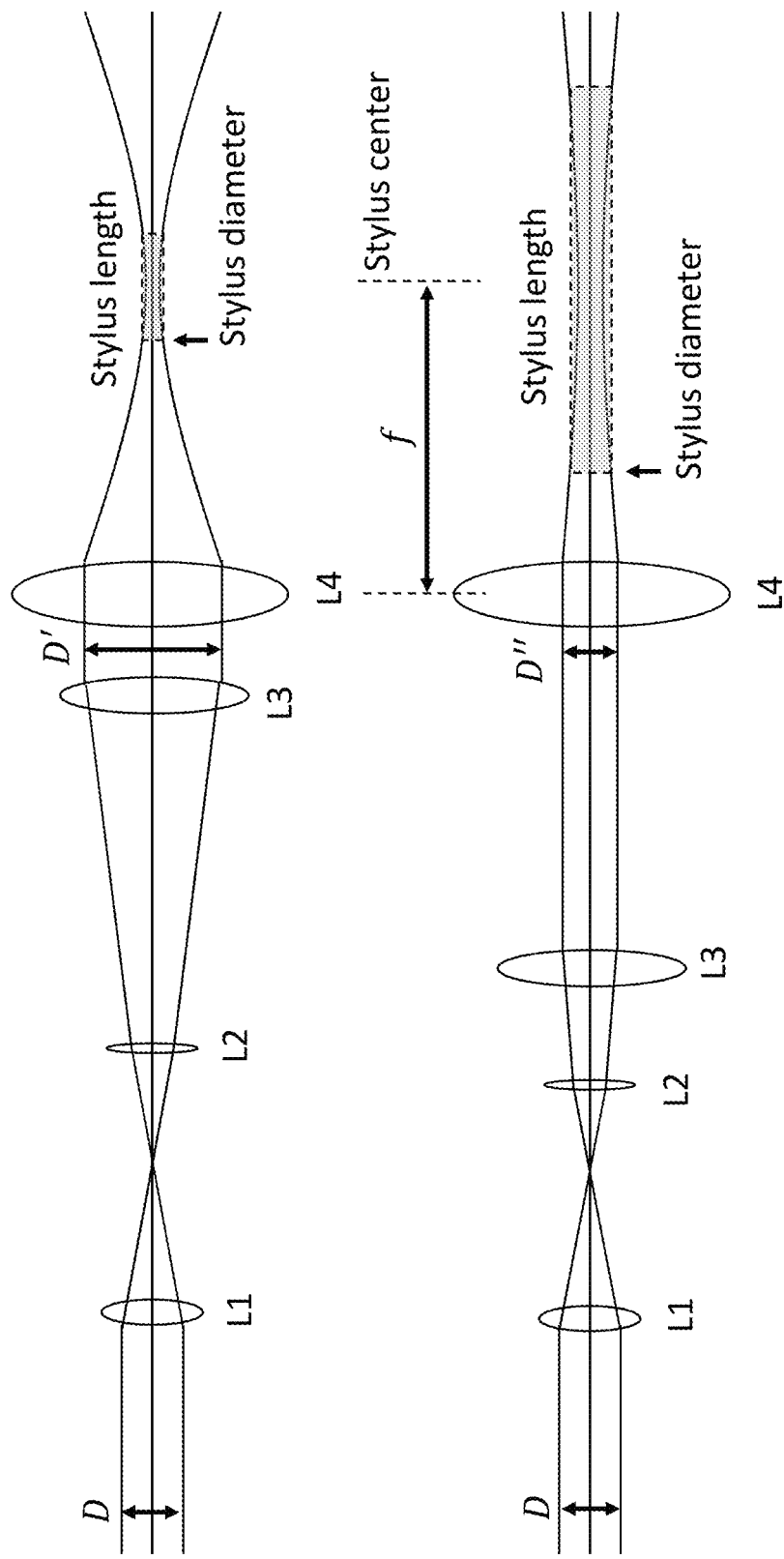
FIG. 19 shows an OCT stylus diameter reconfigured by changing the input beam diameter according to an embodiment.

FIG. 19 shows a method to change the diameter of the input beam to reconfigure the shape of an optical stylus, using focused beam scheme. When D is the original input beam diameter, a three lens system (L1, L2 and L3) performs as a variable beam expander to change the final beam diameter D' on the focusing lens L4. In this design, lens L1 and L4 positions are fixed. Lens L1 convert the input beam into a point source, lens L2 and L3 can be moved along the beam path to form a two lens system with adjustable focal length. When the point source is at the front focal point of the two lens system formed by L2 and L3, the beam on lens L4 is collimated with beam diameter D" variable depending on lens L2 and L3 positions. In this design, it only requires changing two lens (L2 and L3) positions. Lens L1 and lens L4 positions do not need to be changed to reconfigure the shape of the stylus whose center distance from the last lens L4 also remains unchanged. The Engineering Object to be measured is usually positioned near the center of the optical stylus.

Figure 20:
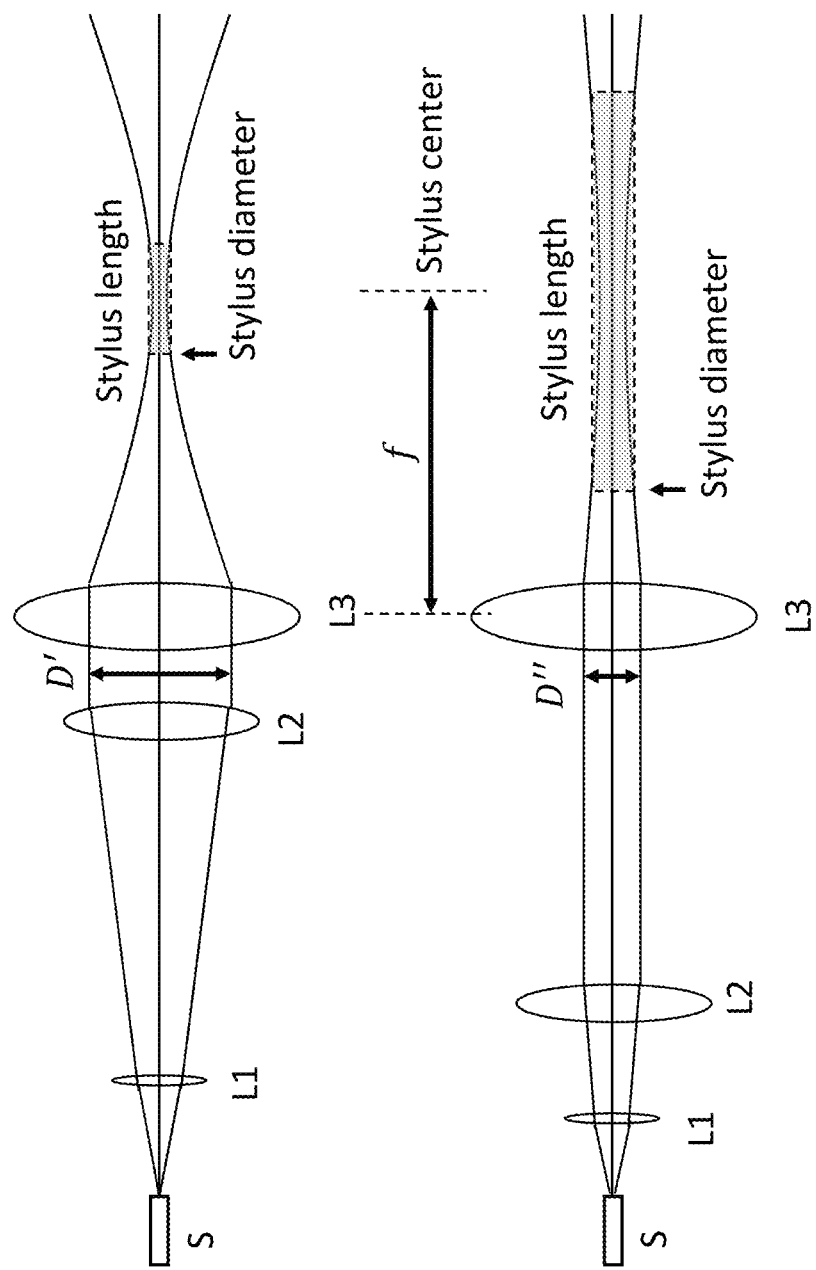
FIG. 20 shows an OCT stylus diameter reconfigured by changing the input beam diameter according to an embodiment.

FIG. 20 shows a method to reconfigure the shape of an optical stylus using focused beam scheme, when the optical input to the probe is a point source (S), such as a fiber. Lenses L1 and L2 have moveable positions along the beam path and changes the diameter of the beam on the last focusing lens L3. As the results the diameter and length of the optical stylus can be changed. In this design, it only requires changing two lens (L1 and L2) positions. Point source S and lens L3 positions do not need to be changed to reconfigure the shape of the stylus whose center distance from the last lens L3 also remains unchanged.

Figure 21:
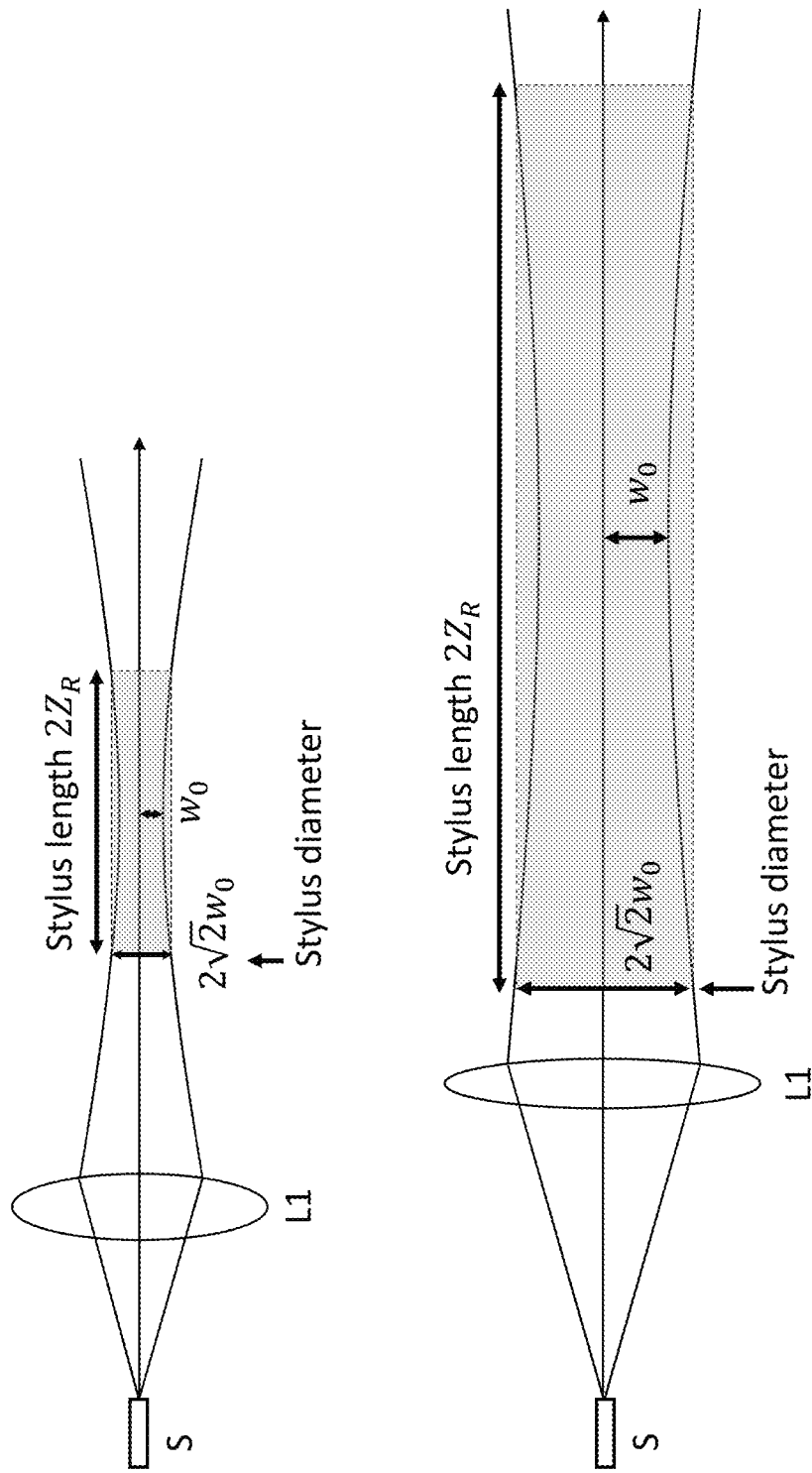
FIG. 21 shows an OCT stylus diameter reconfigured by changing the focal length of collimating lens according to an embodiment.

FIG. 21 shows a method to reconfigure the shape of an optical stylus using collimated beam scheme, when the optical input to the probe is a point source (S), such as a fiber. By changing the focal length of the collimation lens L1, and changing the distance between the point source S and collimation lens L1 such that the point source is near the front focus point of the collimation lens L1, the diameter of the collimated beam after the collimation lens L1 can be changed. The beam waist of the collimated Gaussian beam is also changed. Because the optical stylus is defined as a section near the beam waist of the Gaussian beam, the optical stylus diameter and stylus length can be reconfigured. In order to keep the distance between the point source S and the optical stylus center nearly the same, the distance between the point source and collimation lens L1 is slightly longer than the front focal length of the collimation lens L1. Changing the focal length of a single fixed lens is not possible unless the lens has a deformable shape. It is possible to use multiple lenses to form a lens system with adjustable focal length.

Figure 22:
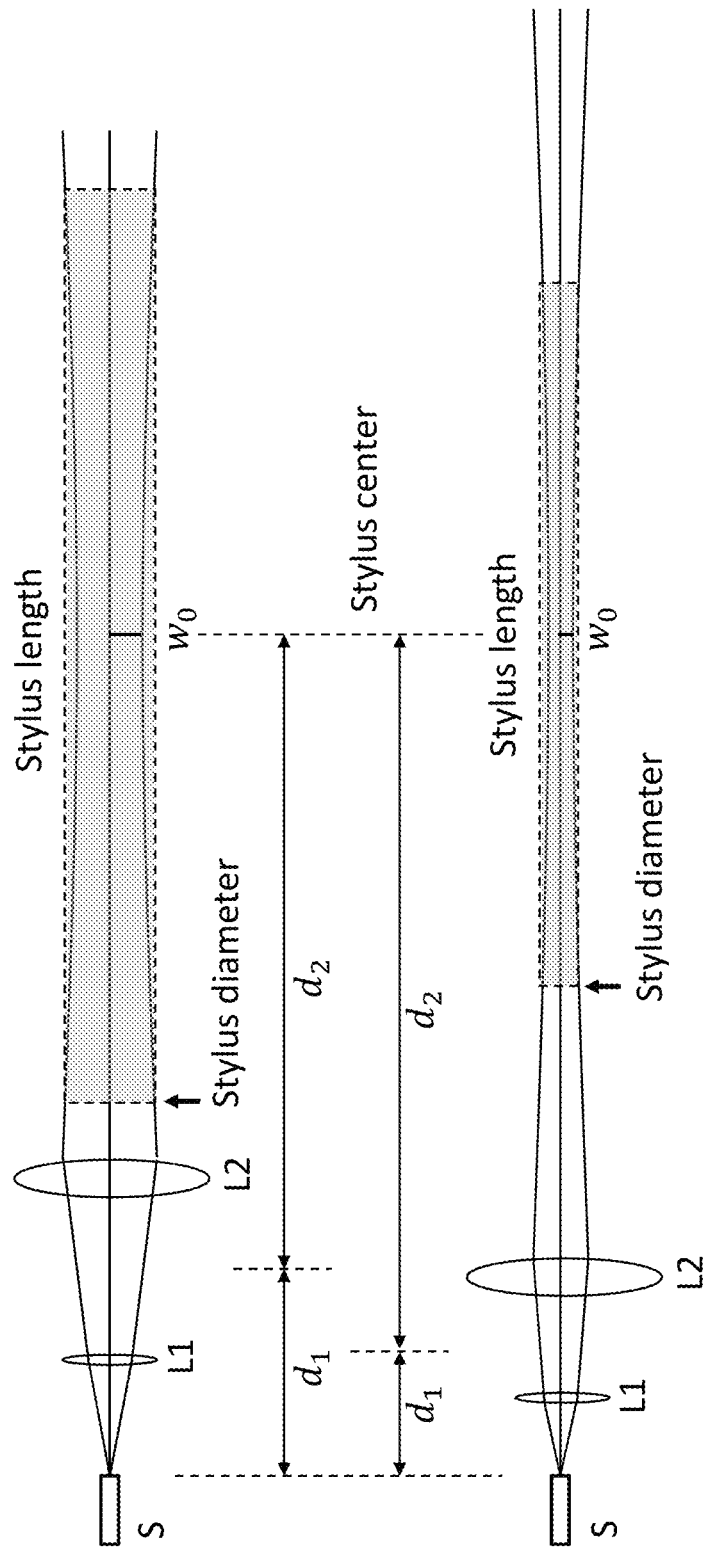
FIG. 22 shows an OCT stylus diameter reconfigured by changing the focal length of collimation lens according to an embodiment.

FIG. 22 shows a method to reconfigure the shape of an optical stylus using collimated beam scheme, without changing the distance between the point source S, such as an input fiber, to the center position of the optical stylus where the object is nearly located. Lens L1 and lens L2 form a two-lens system. By changing the distance between the lens L1 and lens L2 the effective focal length of the two-lens system can be changed. The center position of the two-lens system is also changed so the point source is always near the front focal length of the two-lens system. As the results the diameter of the collimated beam after the two-lens system can be changed, and the diameter and the length of the optical stylus are also changed. By slightly varying the distance between the point source and the center of the two-lens system $d_1$, the distance between the center of the two-lens system and the center of the optical stylus $d_2$ changes very fast. It is possible to keep the total distance $d_1+d_2$ between the point source and the center of the optical stylus nearly a constant when changing the shape of the optical stylus. As one feature of this design the location of the object being measured does not need to be changed relative to the input fiber, when reconfiguring the shape of the optical stylus.

Figure 23:
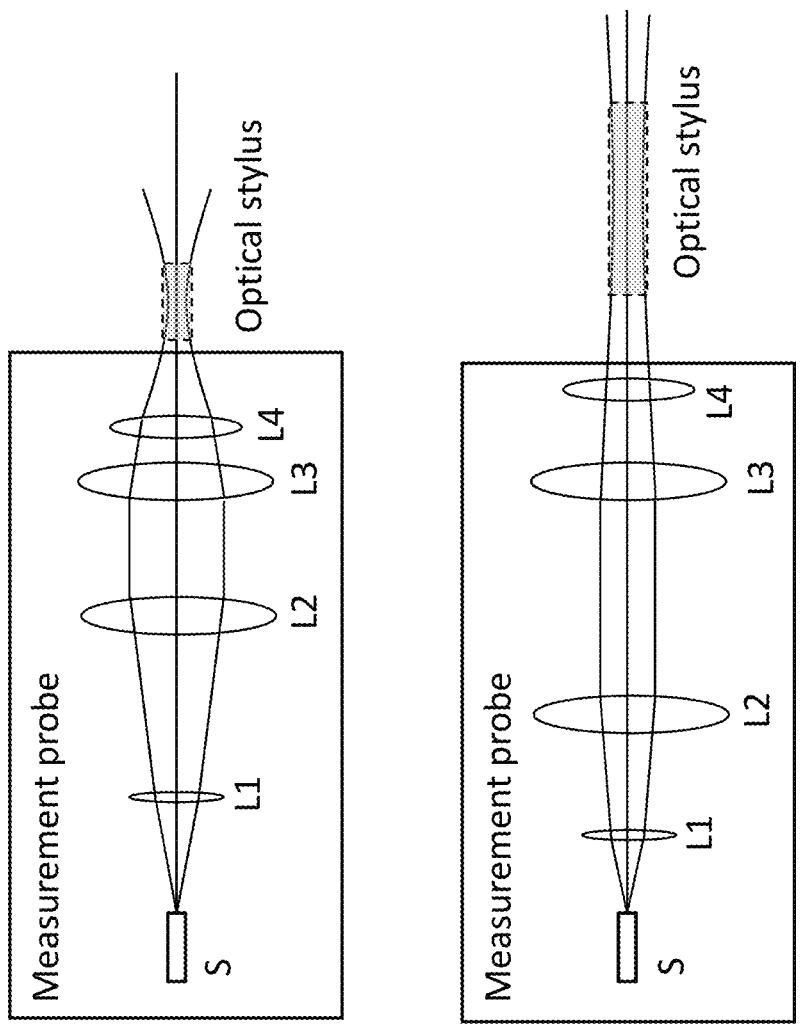
FIG. 23 shows OCT stylus diameter, length and center position are all adjustable according to an embodiment.

FIG. 23 shows a method to reconfigure the shape of an optical stylus, and changing the distance from the stylus center to one of the fixed lens inside the measurement probe. In this design, point source S is the input fiber to the probe, Lens L1 and L2 forms a collimation lens system with variable focal length. Changing Lens L1 and L2 positions together changes the diameter of the collimated beam on lens L3 which is a fixed lens inside the probe, and the diameter and the length of the stylus, if lens L4 position is not changed. Lens 4 is another moveable lens inside the probe. Changing L4 position only changes the effective focal lens of the lens system formed by L3 and L4, causing the stylus center position to change, as well as the stylus diameter and length.

Figure 24:
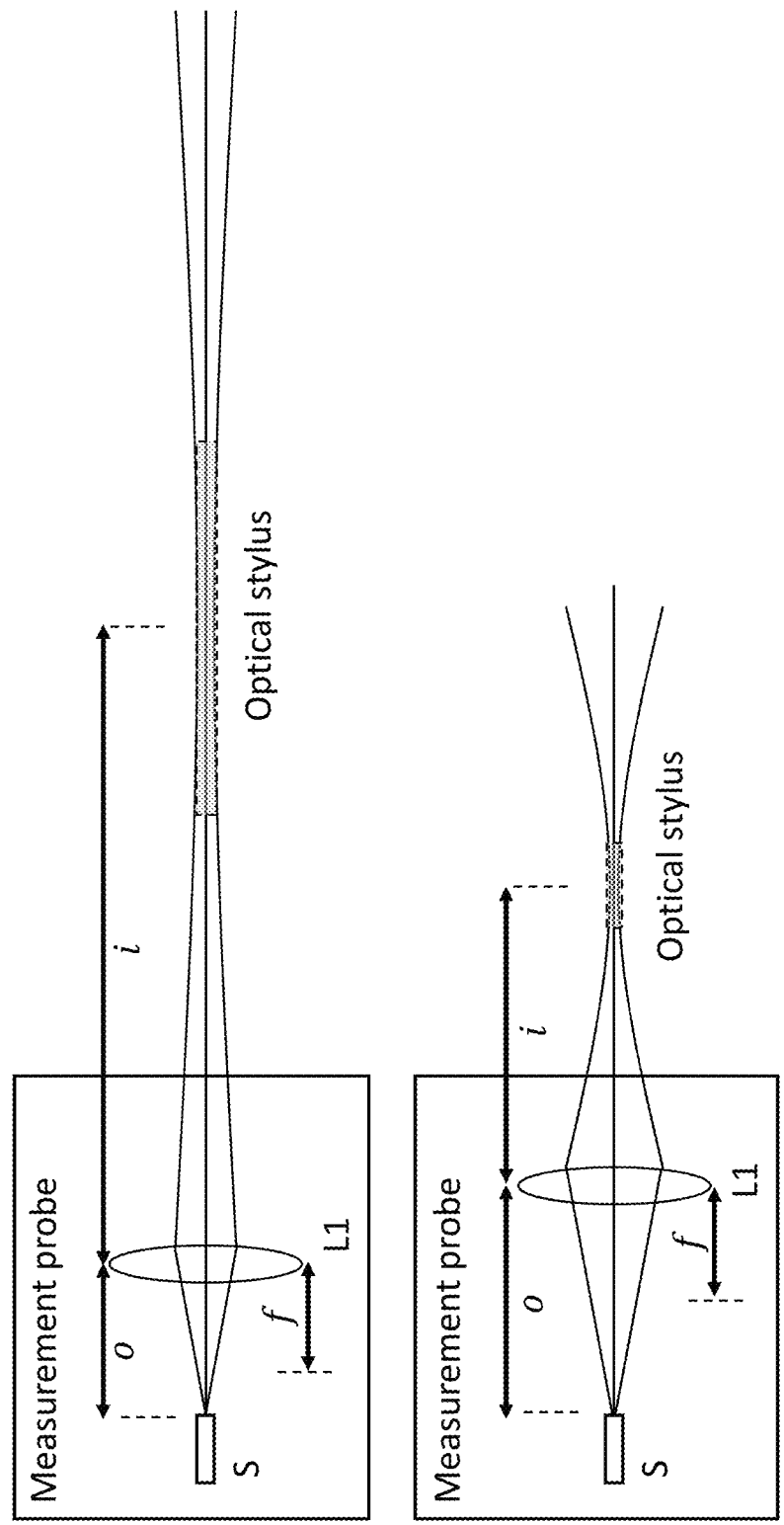
FIG. 24 shows OCT stylus diameter, length and center position are all adjustable according to an embodiment.

FIG. 24 shows a simplified design to change the shape and position of an optical stylus using only one moveable lens inside the measurement probe. Point source S is the input fiber to the probe. Lens L1 can be moved along the beam propagation path. The optical stylus is located at the image location of the point source after the lens. The simple lens equation applies here.

$$\frac{1}{o} + \frac{1}{i} = \frac{1}{f} \quad \text{(Eq. 22)}$$

where o and i are the object and image distance from the lens, and f is the focal length of the lens. When the lens's distance from the source is moved from near f to near 2f, the optical stylus center moves from near infinity to near 2f. This property of the lens can be used to fast adjust the position of the stylus center to compensate for the large height change of the object to be measured. The diameter and length change of the optical stylus can be calculated using Gaussian optics.

Potential Applications

The SS-CMM system can be used for a wide range of industrial applications. It is one type of machine vision that senses the distance of an object from the measurement probe. Enabled by the high spatial resolution and high measurement speed of OCT, a SS-CMM probe could be used in real-time monitoring the product manufacturing processes, such as parts assembly processes requiring close tolerances. The real-time feedback from the probe could be used to correct for unwanted displacement during the production processes such as epoxying, brazing, welding and machining. For example, a simple OCT probe capable of one dimensional measurement can be installed near the cutter in a lathe to monitor the 3D profile of an object that is being machined as the machine moves the object through the cutter, and generate real-time production data. The production data can be checked with the part model or the process model to verify the processing results are acceptable, establishing a close-loop production scheme. A SS-CMM probe can also be used to monitor and compensate for imperfection in the tool work surface, or compensate for dynamic conditions like thermally driven distortions of the work surface or other elements of the machine. The MHz A-Scan rate offered by VCSEL provides sufficient speed for real time monitoring and correction.

The SS-CMM probe can be installed on a robotic arm. The robotic arm would allow the probe to be oriented nearly perpendicular to the object. The robot can be any number of electrically driven, electronically controlled mechanisms that can act on its environment. Adding OCT enabled depth measurement capability to a robot allows quantitative 3D visualization for a robot, which allows the robot to better quantify the environment in which it is operating. The MEMS tunable VCSEL has enabled a swept source OCT system to measure depth range orders of magnitude longer than traditional OCT systems, with un-compromised spatial resolution and measurement speed. The various methods disclosed here to improve an OCT system's performances may be valuable in its future applications.

REFERENCES

Ref 1. D. Huang, E. A. Swanson, C. P. Lin, J. S. Schuman, W. G. Stinson, W. Chang, M. R. Hee, T. Flotte, K. Gregory, C. A. Puliafito, and J. G. Fujimoto, "Optical coherence tomography", Science 254 1178-1181, 1991.

Ref 2. S. H. Yun, G. J. Tearney, J. F. de Boer, N. Iftimia, and B. E. Bouma, "High-speed optical frequency-domain imaging", Opt. Express 11, 2953-2963, 2003.

Ref 3. R. Huber, M. Wojtkowski, and J. G. Fujimoto, "Fourier Domain Mode Locking (FDML): A new laser operating regime and applications for optical coherence tomography", Opt. Lett. 14, 3225-3237, 2006.

Ref 4. A. F. Fercher, C. K. Hitzenberger, G. Kamp, S . Y. El-Zaiat, "Measurement of intraocular distances by backscattering spectral interferometry", Opt. Commun. 117, 43-48, 1995.

Ref 5. N. Nassif, B. Cense, B. H. Park, S. H. Yun, T. C. Chen, B. E. Bouma, G. J. Tearney, and J. F. de Boer, "In vivo human retinal imaging by ultrahigh-speed spectral domain optical coherence tomography", Opt. Lett. 29, 480-482, 2004.

Ref 6. M. Wojtkowski, V. J. Srinivasan, T. H. Ko, J. G. Fujimoto, A. Kowalczyk, J. S. Duker, "Ultrahigh-resolution, high-speed, Fourier domain optical coherence tomography and methods for dispersion compensation", Opt Express 12, 2404-2422, 2004.

Ref 7. E. Beaurepaire, A. C. Boccara, M. Lebec, L. Blanchot, and H. SaintJalmes, "Full-field optical coherence microscopy", Opt. Lett. 23, 244-246, 1998.

Ref 8. A. Dubois, L. Vabre, A. C. Boccara, and E. Beaurepaire, "High-resolution full-field optical coherence tomography with a Linnik microscope", Appl. Opt. 41, 805-812, 2002.

Ref 9. V. Jayaraman, J. Jiang, H. Li, P. J. S. Heim, G. D. Cole, B. Potsaid, J. G. Fujimoto, A. Cable, "OCT Imaging up to 760 kHz Axial Scan Rate using Single-Mode 1310 nm MEMS-Tunable VCSELs with >100 nm Tuning Range", 2011 Conference on Lasers and Electro-Optics (CLEO), Optical Society of America: Baltimore, Md. p. PDPB2, 2011

Ref 10. S. Parthasarathy, J. Birk, J. Dessimoz, "Laser rangefinder for robot control and inspection", Proc. SPIE 336, Robot Vision, 2-10, 1982.

Ref 11. S. Winkelbach, S. Molkenstruck, and F. M. Wahl, "Low-cost laser range scanner and fast surface registration approach", DAGM 2006, LNCS 4174, 718-728, Springer 2006.

Ref 12. J. Geng, "Structured-light 3D surface imaging: a tutorial", Advances in Optics and Photonics 3, 128-160, 2011.

Ref 13. Molesini G., G. Pedrini, P. Poggi, and F. Quercioli, "Focus Wavelength Encoded Optical Profilometer", Opt. Comm. 49, 229-233, 1984.

Ref 14. T. Wilson, ed., Confocal Microscopy, Academic, San Diego, Calif., 1990.

Ref 15. R. Stubbe, B. Sahlgren, "Swept source optical coherence tomography", European patent application EP 1744119.

Ref 16. K. Siercks, T. Jensen, and K. Schneider, "Method and measuring device for gauging surfaces", U.S. Pat. No. 9,127,929.

Ref 17. I. Grulkowski, J. J. Liu, B. Potsaid, V. Jayaraman, C. D. Lu, J. Jiang, A. E. Cable, J. S. Duker, J. G. Fujimoto. "Retinal, anterior segment and full eye imaging using ultrahigh speed swept source OCT with vertical-cavity surface emitting lasers" Biomed. Opt. Exp. 3, 2733-2751, 2012.

Ref 18. I. Grulkowski, J. J. Liu, B. Potsaid, V. Jayaraman, J. Jiang, J. Fujimoto, and A. E. Cable, "High-precision, high-accuracy ultralong-range swept-source optical coherence tomography using vertical cavity surface emitting laser light source", Opt. Lett. 38, 673-675, 2013.

While the present invention has been described at some length and with some particularity with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the invention. Furthermore, the foregoing describes the invention in terms of embodiments foreseen by the inventor for which an enabling description was available, notwithstanding that insubstantial modifications of the invention, not presently foreseen, may nonetheless represent equivalents thereto.

What is claimed is:

1. A method to measure physical and geometrical data of an object using an optical coherence tomography (OCT) system, the method comprising:
    providing a light source that emits light over a wavelength range;
    delivering a portion of the light from the light source as an optical beam to measure the object, and collecting a light signal from the object;
    providing a portion of the light from the light source to a reference light generator of the OCT system for generating a reference light;
    operating the OCT system in a low depth resolution mode to measure the object height with low resolution and an extended depth measurement range, utilizing a partial spectral bandwidth of the light source, the object height with low resolution being based on an optical delay difference between the reference light and the light signal from the object detected by a detector of the OCT system;
    changing an optical delay in the reference light generator of the OCT system to match an object height measured in the low depth resolution mode;
    using a first control loop to control the optical beam focusing conditions for focusing the optical beam onto the object based on the optical delay difference and the object height with low resolution;
    using a second control loop to control the adjustment of optical delay in the reference light generator based on the optical delay difference;
    changing an electronic frequency of the detected signals to be within an optimal electronic frequency detection range of the detector of the OCT system;
    operating the OCT system in a high depth resolution mode to measure the object height with high resolution and a reduced depth measurement range, utilizing a full spectral bandwidth of the light source; and
    the object height is the measured object height in high depth resolution mode adjusted by the changes made to the optical delay in the reference light generator.

2. A method to measure physical and geometrical data of an object using a swept source optical coherence tomography (SSOCT) system, the method comprising:
    providing a light source that sweeps emitted light over a wavelength range;
    delivering a portion of the light from the light source as an optical beam to measure the object and collecting a light signal from the object;
    providing a portion of the light from the light source to a reference light generator of the SSOCT system for generating a reference light;
    operating the SSOCT system in a low depth resolution mode, by reducing the tuning wavelength range of the swept source, to measure the object height with low resolution, the object height with low resolution being based on an optical delay difference between the reference light and the light signal from the object detected by a detector of the SSOCT system;
    changing the optical delay in the reference light generator of the SSOCT system to match the object height measured in the low depth resolution mode;
    using a first control loop to control the optical beam focusing conditions for focusing the optical beam onto the object based on the optical delay difference and the object height with low resolution;
    using a second control loop to control the adjustment of optical delay in the reference light generator based on the optical delay difference;
    changing an electronic frequency of the detected signals to be within an optimal electronic frequency detection range of the detector of the SSOCT system;
    operating the SSOCT system in a high depth resolution mode and a reduced depth measurement range, by using a full tuning wavelength range of the swept source, to measure the object height with high resolution; and
    the object height is the measured object height in high depth resolution mode adjusted by the changes made to the optical delay in the reference light generator.

3. A method to measure physical and geometrical data of a spectral domain coherence tomography (SDOCT) system, the method comprising:
    operating the SDOCT system in a low depth resolution mode, using a spectrometer configured for measuring reduce bandwidth of the broadband source at the highest spectral resolution of the spectrometer, to measure the object height with low resolution over an extended depth range;
    changing the optical delay in the reference light generator of the SDOCT system to match the object height measured in the low depth resolution mode;
    operating the SDOCT system in a high depth resolution mode and a reduced depth measurement range, using a spectrometer configured for measuring the full bandwidth of the broadband source at reduced spectral resolution of the spectrometer, to measure the object height with high resolution in a reduced depth range; and the object height is the measured object height in high depth resolution mode adjusted by the changes made to the optical delay in the reference light generator.

* * * * *